(12) United States Patent
Marubayashi et al.

(10) Patent No.: US 11,359,283 B2
(45) Date of Patent: Jun. 14, 2022

(54) REACTION TUBE STRUCTURE AND SUBSTRATE PROCESSING APPARATUS

(71) Applicant: Kokusai Electric Corporation, Tokyo (JP)

(72) Inventors: Tetsuya Marubayashi, Toyama (JP); Satoru Murata, Toyama (JP); Kosuke Takagi, Toyama (JP); Atsushi Hirano, Toyama (JP); Kiyoaki Yamada, Toyama (JP); Haruo Morikawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/816,125

(22) Filed: Nov. 17, 2017

(65) Prior Publication Data

US 2018/0142353 A1 May 24, 2018

(30) Foreign Application Priority Data

Nov. 18, 2016 (JP) .............................. JP2016-224973
Oct. 17, 2017 (JP) .............................. JP2017-201009

(51) Int. Cl.
  *C23C 16/455* (2006.01)
  *H01L 21/677* (2006.01)
  (Continued)

(52) U.S. Cl.
  CPC .... *C23C 16/45578* (2013.01); *C23C 16/4412* (2013.01); *C23C 16/458* (2013.01);
  (Continued)

(58) Field of Classification Search
  CPC ........ C23C 16/45578; C23C 16/45546; C23C 16/4584; C23C 16/45502; C23C 16/458;
  (Continued)

(56) References Cited

U.S. PATENT DOCUMENTS

2002/0168877 A1* 11/2002 Taniyama ........... C23C 16/4401
 438/790
2009/0258504 A1  10/2009 Nakaiso et al.
 (Continued)

FOREIGN PATENT DOCUMENTS

JP  01-316461 A  12/1989
JP  03-235329 A  10/1991
(Continued)

OTHER PUBLICATIONS

English Translation of JP404010617A, Tani, published Jan. 14, 1992. (Year: 1992).*

(Continued)

*Primary Examiner* — Laura Edwards
(74) *Attorney, Agent, or Firm* — Volpe Koenig

(57) ABSTRACT

A substrate processing apparatus includes a reaction tube defining a substrate processing chamber; a gas inlet provided at a lower portion of the reaction tube to supply a process gas; a first buffer unit for temporarily retaining the process gas, the first buffer unit at a first side of an inner surface of the reaction tube and includes a plurality of gas supply holes; and a gas outlet provided at a second side of the inner surface of the reaction tube opposite to the first side, to exhaust the process gas from the process chamber. The gas supply holes are provided from an upper end portion of the first buffer unit to a lower end portion of the first buffer unit, and the process gas is supplied through the plurality of gas supply holes into the process chamber, passes through the process chamber, and exhausted through the gas outlet.

18 Claims, 14 Drawing Sheets

(51) Int. Cl.
*C23C 16/458* (2006.01)
*H01L 21/67* (2006.01)
*C23C 16/44* (2006.01)
*C23C 16/52* (2006.01)
*H01L 21/673* (2006.01)

(52) U.S. Cl.
CPC .... *C23C 16/4584* (2013.01); *C23C 16/45502* (2013.01); *C23C 16/52* (2013.01); *H01L 21/67109* (2013.01); *H01L 21/67309* (2013.01); *H01L 21/67757* (2013.01); *H01L 21/67769* (2013.01)

(58) Field of Classification Search
CPC ............... C23C 16/4412; C23C 16/52; H01L 21/67769; H01L 21/67757; H01L 21/67109; H01L 21/67309; H01J 37/32844; F27B 5/13; F27B 7/33; F27B 14/0806; F27D 1/0033; F27D 5/00
USPC .......................................... 118/715, 724, 725
See application file for complete search history.

(56) References Cited

U.S. PATENT DOCUMENTS

| | | | |
|---|---|---|---|
| 2011/0065283 A1* | 3/2011 | Sato | C23C 16/34 438/758 |
| 2012/0076936 A1 | 3/2012 | Hirano | |
| 2014/0295667 A1* | 10/2014 | Kaga | H01L 21/68764 438/680 |
| 2017/0294318 A1 | 10/2017 | Yoshida et al. | |

FOREIGN PATENT DOCUMENTS

| | | | |
|---|---|---|---|
| JP | 404010617 A | * | 1/1992 |
| JP | 06-188238 A | | 7/1994 |
| JP | 07-176498 A | | 7/1995 |
| JP | 09-260300 A | | 10/1997 |
| JP | 11-067750 A | | 3/1999 |
| JP | 2002-343782 A | | 11/2002 |
| JP | 2009-259894 A | | 11/2009 |
| JP | 2011-035191 A | | 2/2011 |
| JP | 2011-066106 A | | 3/2011 |
| JP | 2012-069723 A | | 4/2012 |
| KR | 10-2015-0072702 A | | 6/2015 |
| WO | 2015/041376 A1 | | 3/2015 |

OTHER PUBLICATIONS

Korean Office Action dated May 10, 2019 for the Korean Patent Application No. 10-2017-0152752.
Singaporean Office Action dated Jun. 10, 2019 for the Singaporean Patent Application No. 10201709508T.
Korean Office Action dated Dec. 18, 2019 for the Korean Patent Application No. 10-2017-0152752.
Written Opinion dated Mar. 17, 2020 for Singaporean Patent Application No. 10201709508T.
Japanese Office Action dated Jan. 28, 2020 for the Japanese Patent Application No. 2017-201009.
Chinese Office Action dated Apr. 25, 2021 for Chinese Patent Application No. 201711146022.9.
Singapore Office Action dated Jan. 15, 2021 for Singapore Patent Application No. 10201709508T.

* cited by examiner

REACTION TUBE STRUCTURE AND SUBSTRATE PROCESSING APPARATUS

CROSS-REFERENCE TO RELATED PATENT APPLICATION

This non-provisional U.S. patent application claims priority under 35 U.S.C. § 119 of Japanese Patent Application No. 2016-224973, filed on Nov. 18, 2016 and Japanese Patent Application No. 2017-201009, filed on Oct. 17, 2017, the entire contents of which are hereby incorporated by reference.

BACKGROUND

1. Field

The present disclosure relates to a reaction tube structure and a substrate processing apparatus including the same.

2. Description of the Related Art

Conventional substrate processing apparatus subjects a substrate to processes such as oxidation and diffusion (particularly, pyroprocessing, dry oxidation and annealing). For example, in the conventional substrate processing apparatus, a gas is introduced through a gas inlet installed at the bottom of a reaction tube, and then supplied into the reaction chamber through the ceiling portion of the reaction tube. The gas supplied in the reaction chamber flows from the upper portion of a substrate processing region to a lower portion and is exhausted from the reaction chamber through the exhaust port installed at the lower portion of the reaction tube. In the following description, a substrate may be referred to as a wafer. In the conventional substrate processing apparatus, an inner pressure of the reaction chamber is adjusted to a predetermined pressure using only the exhaust performance of an exhaust device before the substrate is processed. A space for temporary retention of the gas to adjust the pressure is provided in the ceiling portion of the conventional substrate processing apparatus. For example, a plurality of openings configured to eject gases is provided, under the space. The gas is uniformly supplied into the reaction chamber through the plurality of openings.

In the conventional substrate processing apparatus, the temperature of the gas is raised while the gas is supplied from the bottom to the top of the nozzle integrated in the reaction tube. By supplying a high temperature gas into the reaction chamber through the ceiling portion, the temperature differences among the members provided in the reaction chamber, for example, SiC members, quartz members and wafers are reduced resulting in the reduction of the generation of particles.

However, the flow velocity of the gas on the surface of each of plurality of stacked wafers from the upper end to the lower end of the boat is slow. Since outgas of gas (outgas) generated on the wafer surface during heat treatment becomes insufficient, out gas increases. As a result, the particles over the surfaces of the plurality of wafers from the films on the plurality of wafers increase when a heat treatment is performed. Here, in the present specification, outgas refers to degassing from the wafer by heat treating this apparatus from the film formed on the wafer in pre-treatment. Thereafter, this outgas is sometimes simply referred to as degassing.

SUMMARY

Described herein is a technique capable of increasing a flow velocity of gas at a surface of a wafer.

According to one aspect of the technique described herein, there, is provided a substrate processing apparatus including: a reaction tube structure, wherein the reaction tube structure includes: a reaction tube defining a process chamber where a plurality of substrate is processed: a gas inlet provided at a lower portion of the reaction tube and configured to supply a process gas; a first buffer unit where the process gas is temporarily retained, wherein the first buffet unit is disposed at a first side of an inner surface of the reaction tube and includes a plurality of gas supply holes configured to supply the process gas into the process chamber; a connecting pipe disposed between the gas inlet and the first buffer unit to connect the gas inlet to the first buffer unit; and a gas outlet provided at a lower portion of a second side of the inner surface of the reaction tube opposite to the first side, wherein the gas outlet is configured to exhaust the process gas from the process chamber, wherein the plurality of gas supply holes are provided from an upper end portion of the first buffer unit to a lower end portion of the first buffer unit facing the gas outlet, and the process gas is supplied through the plurality of gas supply holes into the process chamber, passes through the process chamber, and exhausted through the gas outlet.

DETAILED DESCRIPTION

The substrate processing apparatus described herein processes semiconductor wafers. The substrate processing apparatus performs processes such as oxide film formation, diffusion, and CVD on semiconductor wafers. According to the embodiments described herein, the semiconductor wafers (substrates) 200 are fabricated from a semiconductor such as silicon. According to embodiments, a front opening unified pod (FOUP) 110 is used as a carrier (container) for accommodating and transporting the wafer 200.

Figure 1:
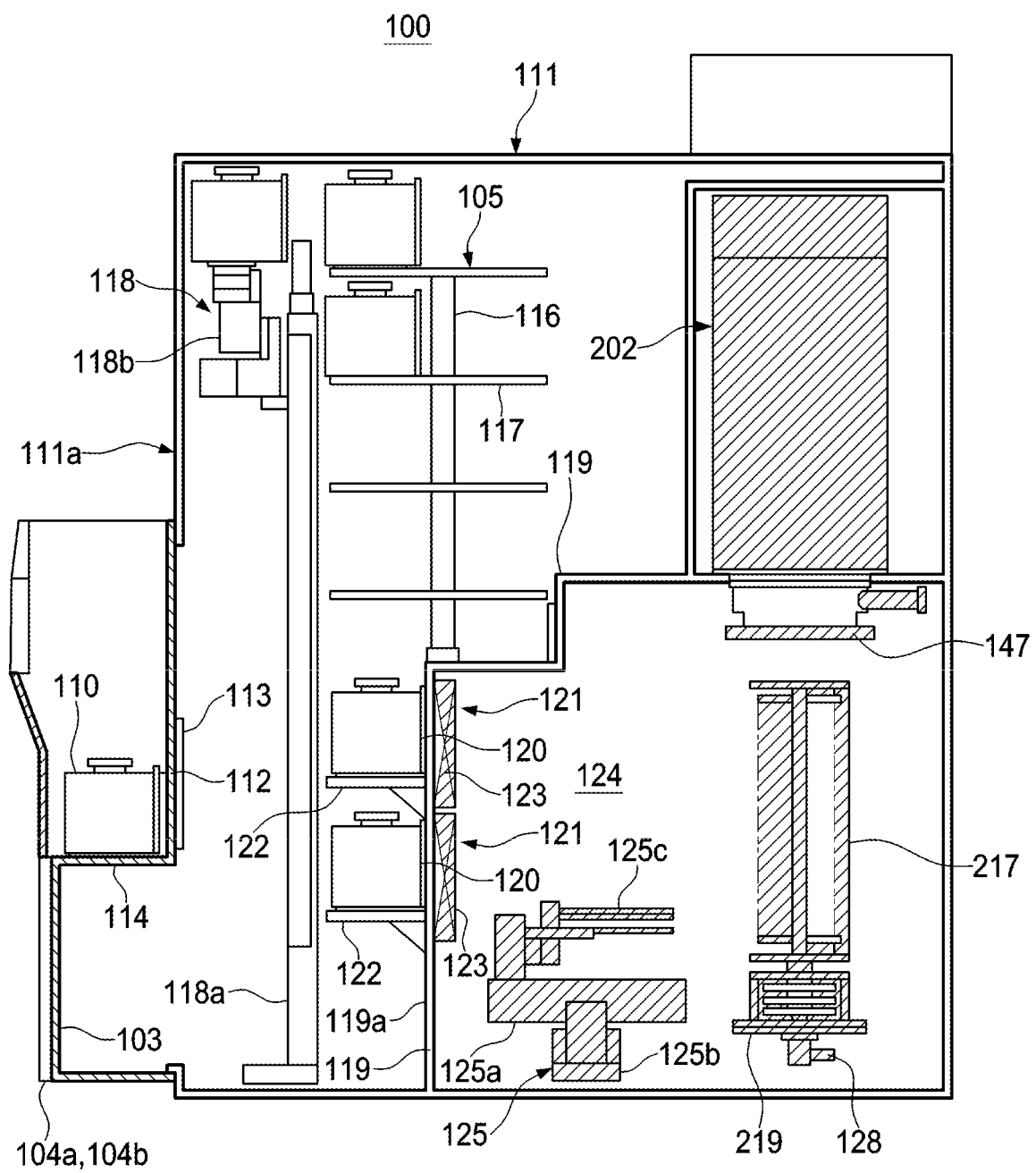
FIG. 1 schematically illustrates a substrate process g apparatus according to an embodiment of the present disclosure.

As shown in FIG. 1, a substrate processing apparatus 100 includes a housing 111 having a front wall 111a. A maintenance space is provided at the lower front side of the housing 111. Front maintenance doors 104a and 104b, which open and close the maintenance space, are provided at the lower front side of the housing 111.

A pod loading/unloading port 112 is provided at the front wall 111a of the housing 111 for loading and unloading FOUP 110 (hereinafter, also referred to as "pod") into and from the housing 111. A front shutter 113 opens and closes the pod loading/unloading port 112.

A loading shelf 114 is provided in front of the pod loading/unloading port 112. The pod 110 is aligned while placed on the loading shelf 114. The pod 110 is loaded onto or unloaded from the loading shelf 114 by an in-step transfer apparatus (not shown).

An accommodating shelf 105 is provided over the substantially center portion in the front-rear direction in the housing 111. The accommodating shelf 105 is for storing the pod 110 and is rotatable. The accommodating shelf 105 may hold a plurality of pods 110. That is, the accommodating shelf 105 includes a vertical column 116 and a plurality of shelf plates 117 provided on the column 116. The pod. 110 is placed on and supported by the shelf plate 117.

A pod transport device (first transport device) 118 is provided between the loading shelf 114 and the accommodating, shelf 105 in the housing 1.11. The pod transport device 118 include a pod elevator 118a and a pod transport mechanism 118b capable of elevating while supporting the pod 110. The pod transport device 118 transports, the pod 110 among the loading shelf 114, the accommodating shelf 105 and the pod opener 121 by consecutive operations of the pod elevator 118a and the pod transport mechanism 118b.

The substrate processing apparatus 100 includes a semiconductor manufacturing apparatus that performs processes such as oxide film formation. A sub-housing 119, which is a housing of the semiconductor manufacturing apparatus, is provided below the substantially center portion in the front-rear direction in the housing 111 toward the rear end of the substrate processing apparatus 100.

A pair of wafer loading/unloading ports 120 is provided at a front wall 119a of the sub-housing 119. The wafer 200 is loaded into unloaded from the sub-housing 119 through the pair of wafer loading/unloading ports 120. The pair of wafer loading/unloading ports 120 is simply referred to as substrate loading/unloading ports. The pair of wafer loading/unloading ports 120 is vertically arranged in two stages. A pod opener 121 is provided at upper and lower wafer loading/unloading ports 120, respectively.

The pod opener 121 includes a support 122 on which the pod 110 is placed, and a cap opener 123 for detaching the cap of the pod 110. When the cap of the pod 110 placed on the support 122 is detached by the cap opener 123, the wafer entrance of the pod 110 is opened.

The sub-housing 119 defines a transfer chamber 124 fluidically isolated from the space in which the $^{pod}$ transport device 118 or the accommodating shelf 105 is provided. A wafer transport mechanism 125 is provided in the front portion of the transfer chamber 124. The wafer transport mechanism 125 is also referred to as a substrate transport mechanism 125. The substrate transport mechanism 125 includes a wafer transport device 125a and a wafer transport apparatus elevator 125b. The wafer transport device 125a and the wafer transport apparatus elevator 125b are also referred to as substrate transport device 125a and a substrate transport apparatus elevating mechanism 125b, respectively. The substrate transport device 125a supports the wafer 200 by tweezers 125c and horizontally rotates or moves the wafer 200 up and down. The substrate transport apparatus elevating mechanism 125b ascends and descends the substrate transport device 125a. The substrate transport mechanism 125 may charge or discharge the wafer 200 into or from the boat 217 by consecutive, operations of the substrate transport apparatus elevating mechanism 125b and the substrate transport device 125a. The boat 217 is also referred to as substrate retainer 217.

A boat elevator (not shown), which is an elevating mechanism to be described later, is provided in the transfer chamber 124. The boat elevator elevates the boat 217. A seal cap 219 is provided horizontally at the arm connected to the boat elevator. The seal cap 219 may support the boat 217 vertically and close the lower end of a processing furnace 202. The boat 217 includes a plurality of support members (not shown). The plurality of support members of the boat 217 is configured to support plurality of wafers 200 (e.g., 50 to 125 wafers) aligned concentrically in horizontal orientation.

The support members are made of materials such as quartz (SiO2), silicon carbide (SiC), and silicon (Si). The material may be selected according to the process temperature. For example, when a process temperature is less than 950° C., quartz may used, and when the process temperature is higher than 950° C., SiC or Si may be used. The shape of the support member may vary depending on the process conditions.

Next, the operation of the substrate processing, apparatus 100 will be described. As shown in FIG. 1, when the pod 110 is placed on the loading shelf 114, the front shutter 113 is opened and the pod 110 placed on the loading shelf 114 is transported into the housing 111 through the pod loading/unloading port 112 by the pod transport device 118.

The pod 110 transported into the housing 111 is automatically transported to and temporarily stored in the designated shelf plate 117 of the accommodating shelf 105 by the pod transport device 118, and then transported toward the opener 121 from the shelf plate 117 and placed on the support 122. Simultaneously, the wafer loading/unloading port 120 of the pod opener 121 is closed by the cap opener 123, and the transfer chamber 124 is filled with clean air.

When the wafer entrance of the pod 110 placed on the support 122 is pressed against the wafer loading/unloading port 120 of the front wall 119a of the sub-housing 119, the cap opener 123 detaches the cap of the pod 110 and the wafer entrance of the pod 110 is opened. The wafer 200 is then transported out of the pod 110 by the tweezers 125c of the substrate transport device 125a, aligned by a notch alignment device, and charged into the boat 217 (wafer charging). The substrate transport device 125a then returns to the pod 110 and transports the next wafer 200 from the pod 110 into the boat 217.

While the substrate transport mechanism 125 loads die wafer 200 from one of the upper pod opener 121 and the lower pod opener 121 into the boat 217, another pod 110 is transported by the pod transport device 118 to the other one of the upper pod opener 121 and the lower pod opener 121, and opened.

When a predetermined number of wafers 200 are charged into the boat 217, a furnace opening gate valve 147 at the lower end of the processing furnace 202 is opened. The seal cap 219 is elevated by the elevating mechanism 115 and the boat 217 supported by the seal cap 219 is loaded into the processing furnace 202.

After the boat 217 is loaded into the processing furnace 202, the wafers 200 are processed in the processing furnace 202. After the wafers 200 are processed, the boat 217 is unloaded by an elevating mechanism (not shown). The wafers 200 and the pod 110 are unloaded from the housing 111 in the order reverse to that described above except for the aligning process of the wafers 200 by the notch alignment device (not shown).

Figure 2:
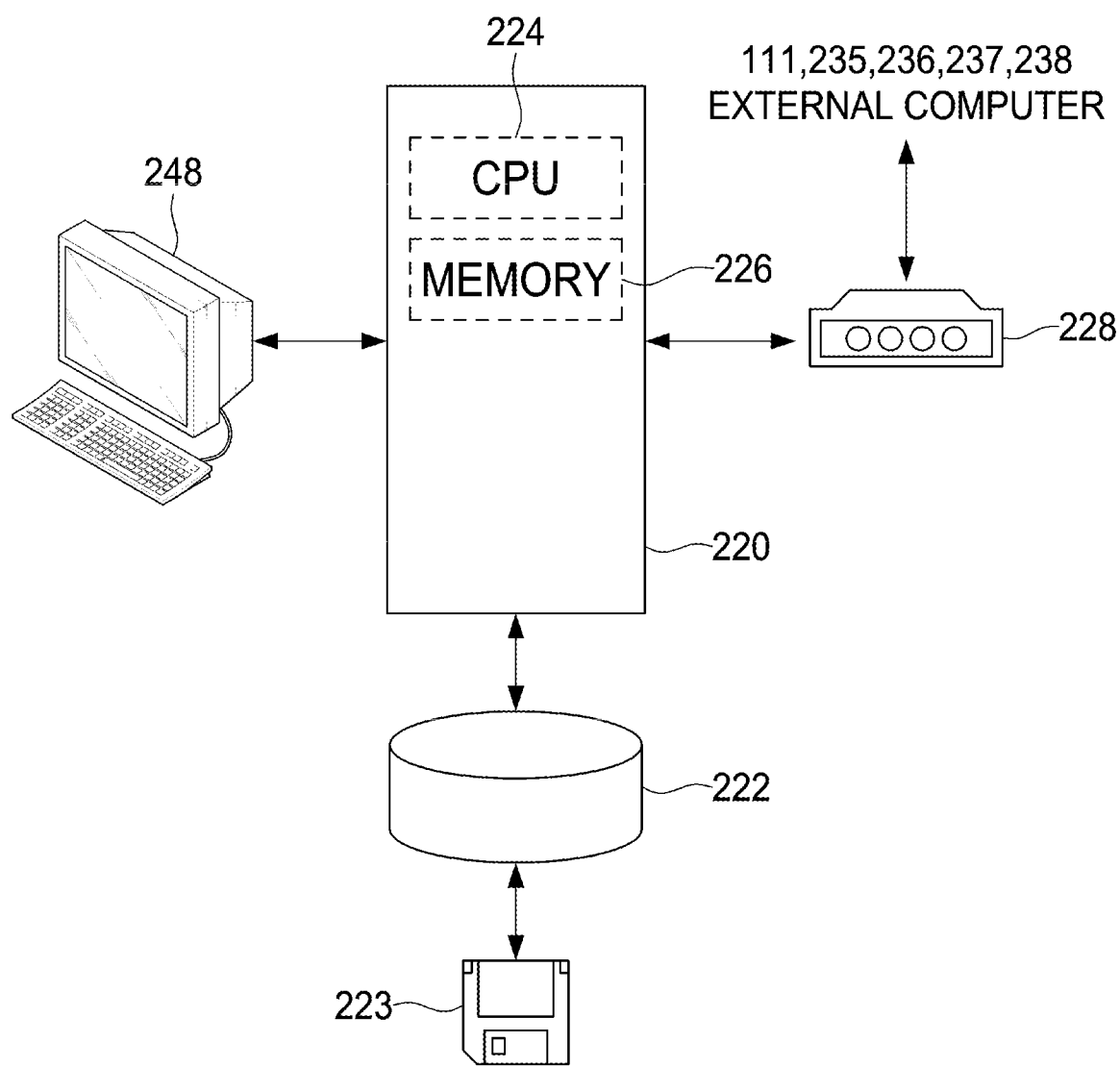
FIG. 2 schematically illustrates a controller of the substrate processing apparatus according to the embodiment of the present disclosure.

Next, the configuration of a controller (control unit) 240 will be described with reference to FIG. 2. The control unit 240 may be embodied by a computer that includes a CPU (central processing unit) 224, a memory unit 226 such as a RAM for temporary storage and a ROM, a hard disk drive (HDD) 222, which is a storage unit, and a transceiver module 228, which is a communication unit. The control unit 240 may include an instruction unit 220 including the CPU 224 and the memory 226, the transceiver module 228 and the hard disk drive 226 as well as a display unit such as a liquid crystal display and a user interface unit (operation unit) 248 including a keyboard and a pointing device such as a mouse. A recipe file containing recipe defining processing conditions and processing sequences, a control program file containing a control program for executing the recipe, a parameter file containing parameters for configuring the processing condition and the processing sequence, as well as a recipe file for storing the recipe in which the processing conditions and the processing sequences as well as a display file defining an input screen for entering process parameters are stored in the hard disk 222.

The communication unit 228 of the control unit 240 may be connected to a switching hub. The control unit 240 may transmit and receive data to and from an external computer via the network using the communication unit 228.

The control unit 240 is electrically connected to sensors, a mass flow controller (MFC) 235, a pressure control unit 236, an operation control unit 237 and a temperature control unit 238 provided in the housing 111 via a communication line through a communication unit 228.

The control unit 240 according to a first embodiment may be embodied by a general computer system as well as a dedicated system. The control unit 240 may be embodied by installing in a general computer the program for executing predetermined processes from a storage media (e.g. a flexible disk, a CD-ROM and a USB) storing the program.

There are various ways to provide the program. For example, the program may be provided through a storage media as described above, a communication line, a communication network or a communication system. Furthermore, the program posted on a bulletin hoard on the communication network may be received via a network. The program may be executed under an operating system just like any other application programs.

First Embodiment

The first embodiment will be described in more detail with reference to FIGS. 3 through 6, FIG. 9 and FIG. 10.

Figure 3:
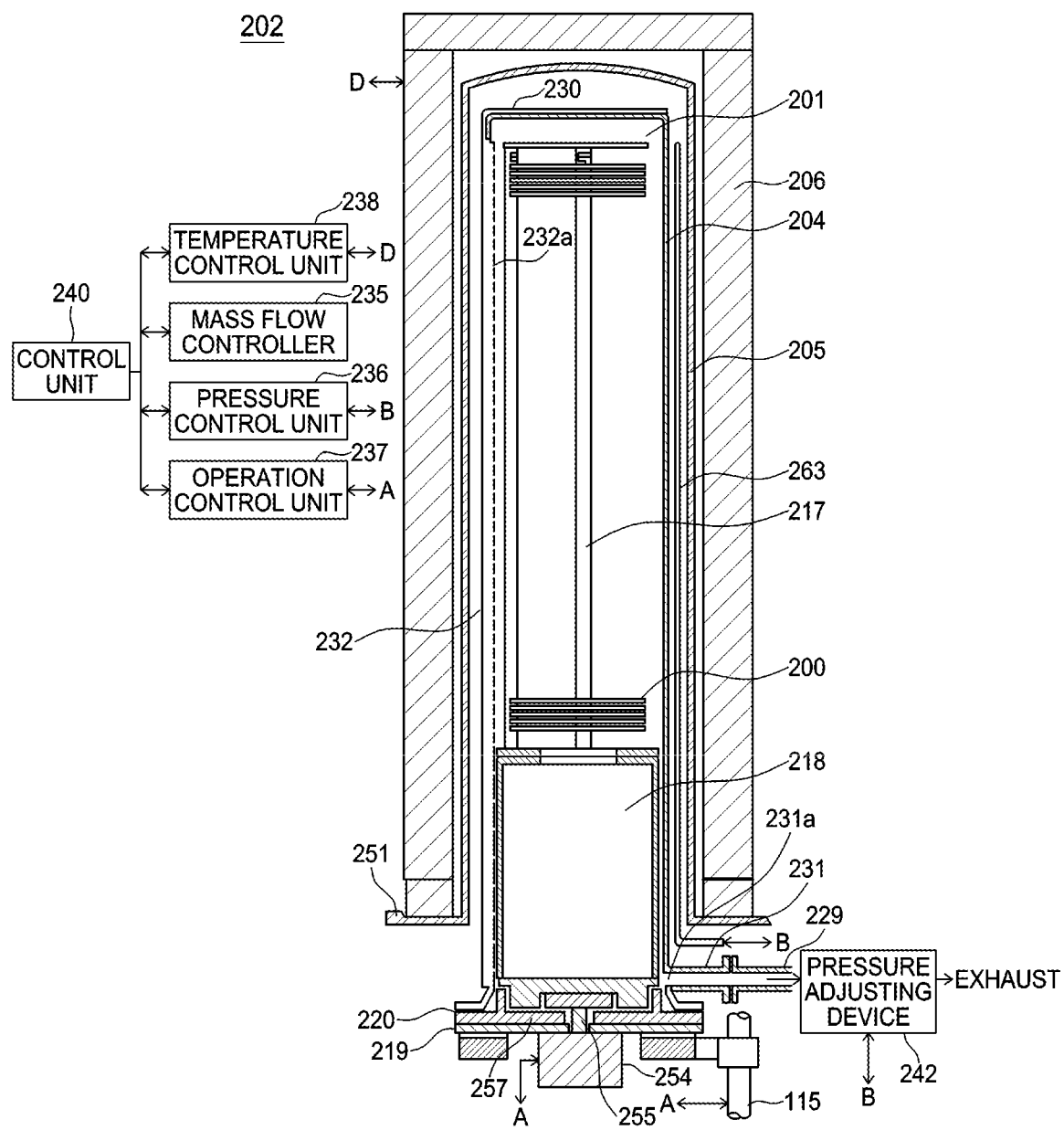
FIG. 3 schematically illustrates a vertical cross-section of a processing furnace of the substrate processing apparatus according to a first embodiment.

As shown in FIG. 3, the processing furnace 202 includes a heater (heating mechanism) 206. The heater 206 is cylindrical and vertically supported by a support plate (heater base) 251.

A liner tube (outer tube) 205 is provided inside the heater 206 concentrically with the heater 206. The liner tube 205 is made of a heat-resistant material such as SiC, and is cylindrical with a closed upper end and an open lower end. A reaction tube (inner tube) 204 is concentrically provided inside the liner tube 205. The reaction tube 204 is made of a heat-resistant material such as quartz, and is cylindrical with a closed upper end, and an open lower end. The hollow center portion of the reaction tube 204 functions as process chamber 201. The boat 217 supporting the wafers 200 in horizontal orientation vertically aligned in multiple stages is accommodated in the process chamber 201.

A thin pipe (connecting pipe) 230 extends from a gas inlet 233 via ceiling portion of the reaction tube 204 a first buffer unit (buffer box) 232 along the outer wall surface of the reaction tube 204. A gas outlet 231 for exhausting the inner atmosphere of the reaction tube 204 through an exhaust port 231a is provided at the lower portion of the reaction tube 204 opposite to the first buffer unit 232.

As shown in FIG. 3, a process gas supply source (not shown), a carrier gas supply source (not shown) and an inert gas supply source (not shown) are connected to an upstream side of the gas inlet 233 via the MFC 235. The MFC 235 controls the flow rate of gas supplied into the process chamber 201 to a desired flow rate at a desired timing. A gas supply system according to the first embodiment includes at least the process gas supply source, the carrier gas supply source, the inert gas supply source and the MFC 235).

The sequencer (not shown) is configured to control the supply of gas by opening and closing a valve (not shown). The control unit 240 is configured to control the MFC 235 and the sequencer to adjust the flow rate of the gas supplied into the process chamber 201 to be a desired flow rate at a desired timing.

Figure 4:
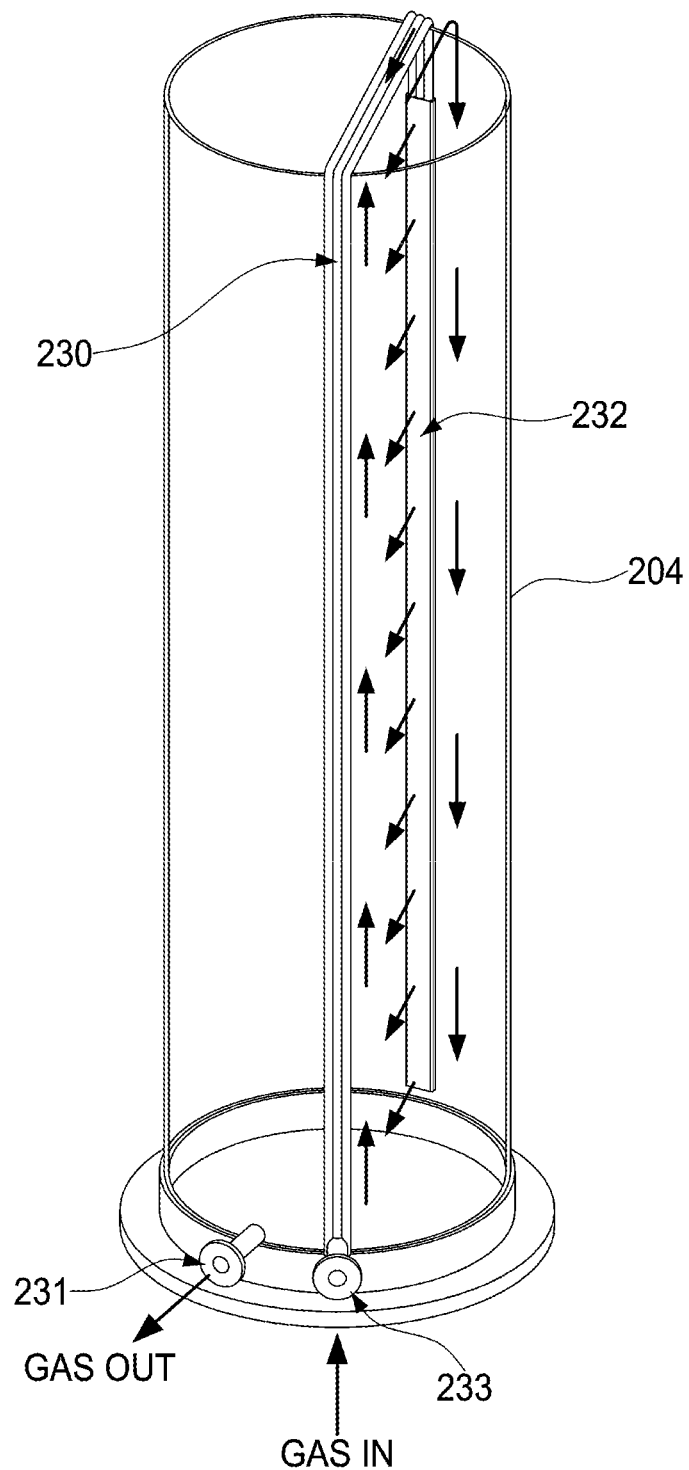
FIG. 4 schematically illustrates a reaction tube structure of the substrate processing apparatus according to the first embodiment.

FIG. 4 illustrates a reaction tube structure 2040 according to the first embodiment in detail. The reaction tube structure 2040 includes the reaction tube 204, the gas inlet 233, the first buffer unit 232, the thin pipe 230, and the gas outlet 231. In FIG. 4, only the outline of the reaction tube 204 is shown to facilitate the understanding of the reaction tube structure 2040. The reaction tube 204 defines the process chamber 201 in which the substrates 200 are processed. The gas inlet 233 through which the gas is introduced and the gas outlet 234 through which the gas is discharged are provided at the lower portion of the reaction tube 204. The first buffer unit 232, which extends from the vicinity of the ceiling portion to the lower portion of the reaction tube 204, is provided on the inner surface of the reaction tube 204 opposite to the gas outlet 231. The first buffer unit 232 may be a part of the sidewall of the reaction tube 204 and the gas supplied through the thin pipe 230 temporarily stays in the first buffer unit 232. The thin pipe 230 is connected to the gas inlet 231 The first buffer unit 232 is spatially connected the gas inlet 233 through the thin pipe 230. The first buffer unit 232 is connected to the thin pipe 230 at the ceiling portion of the reaction tube 204.

The first buffer unit 232 is provided with a plurality of gas supply holes 232a through which gas, is ejected. The gas supply holes 232a are disposed from the upper end to the lower end of the first butler unit 232. The gas is supplied into the process chamber 201 through the plurality of gas supply holes 232a. The gas outlet 231 is provided at the lower portion of the reaction tube 204 opposite to the plurality of gas supply holes 232a. The gas outlet 231 is configured to discharge the gas from the process chamber 201. In such structure, the gas flow is formed parallel to the surfaces of the wafers 200 (lateral flow). In the above description, the "ceiling portion" refers to the portion of the reaction tube 204 above the first buffer unit 232.

As shown in FIG. 4, the gas inlet 233, the first buffer unit 232 provided with the plurality of gas supply holes 232a, the thin pipe 230 connecting the gas inlet 233 and the first buffer unit 232 and the gas outlet 231 are integrally provided in the reaction tube 204. Particularly, the thin pipe 230 extends along the outer wall surface of the reaction tube 204 front the bottom of the reaction tube 201 to the ceiling portion of the reaction tube 204 whereat the thin pipe 230 is connected to the first buffer unit 232, For example, the gas inlet 233 and the thin pipe 230 may be welded along the outer wall surface of the reaction tube 204. The thin pipe 230 may include a plurality of pipes. The thin pipe 230 may not necessarily be in contact with the outer wall surface of the reaction tube 204.

In the reaction tube structure 2040, the gas flows from the gas inlet 233 provided at the lower portion of the reaction tube 204 to the first buffer unit 232. The gas is heated by the heater 206 while the gas temporarily stays in the first buffer unit 232 The gas heated to a high temperature by the heater 206 is supplied into the process chamber 201 through the first buffer unit 232. As a result, the temperature differences among the gas, the SiC member, the quartz member and the waters 200 are reduced such that the generation of particles due to temperature differences is reduced. The shape of the thin pipe 230 is not limited to the first embodiment shown in FIG. 4. For example, the thin pipe 230 may have a spiral shape and a curved shape.

The first buffer unit 232 is provided on the inner surface of the reaction tube 204. The first buffer unit 232 adjusts the pressure of the gas by temporarily retaining the gas and uniformly supplies the gas through the plurality of gas supply holes 232a. The volume of the first buffer unit 232 and the number of the gas supply holes 232a may be determined depending on the flow rate of the gas, the inner pressure and temperature such that the gas is uniformly distributed along the upper portion and the lower portion of the first buffer unit 232.

Figure 5:
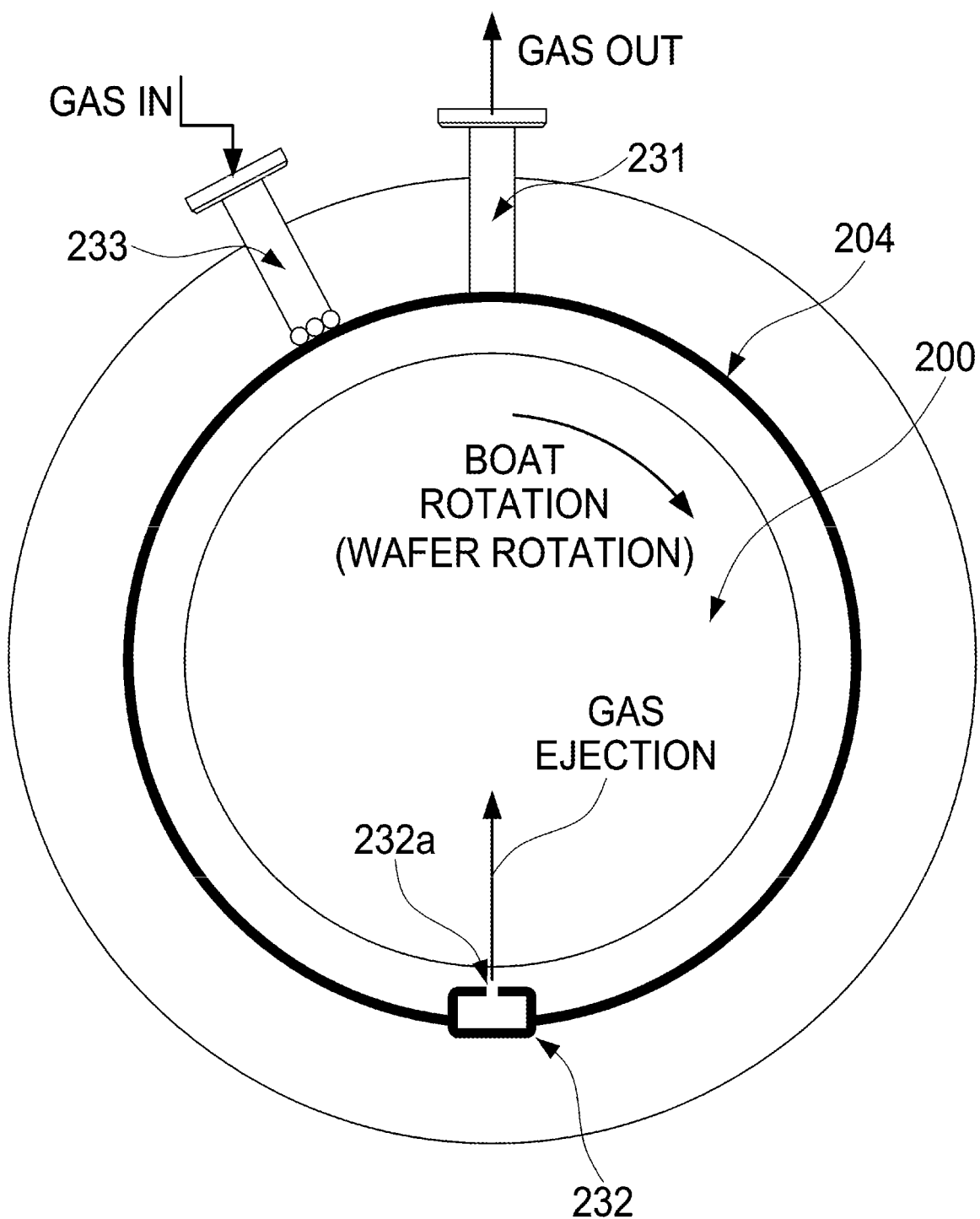
FIG. 5 schematically illustrates a horizontal cross-section of the reaction tube structure of the substrate processing apparatus according to the first embodiment.

As shown in FIG. 5, the first buffer unit 232 is provided at a first side (one side) of the reaction tube 204 and the gas outlet 231 is provided on a second side (another side) the reaction tube 204 opposite to the first side. That is, the first buffer unit 232 is disposed symmetrically to the gas outlet 231 with respect to the center of the wafer 200 such that the gas flows toward the center of the wafer 200 which the gas supply holes 232a face. The gas supply holes 232a provided in the first buffer unit 232 are arranged to correspond to the pitch of the wafers 200 charged in the boat 217. As a result, the gas may be ejected into the space between two neighboring wafers 200 through the plurality of gas supply holes 232a. As shown in FIG. 5, it is preferable that the first buffer unit 232 (and the plurality of gas supply holes 232a) and the gas outlet 231 are in-line when viewed from above. The diameter of each of the gas supply holes 232a may range from 1 mm to 3 mm. The first buffer unit 232 may be provided in a manner that the surface on which the plurality of gas supply holes 232a are provided is aligned to the inner wall surface of the reaction tube 204. In addition, the first buffer unit 232 may he provided in a manner that the surface of the first buffer unit 232 opposite to the surface on which the plurality of gas supply holes 232a are provided is aligned to the inner wall surface of the reaction tube 204.

Figure 10:
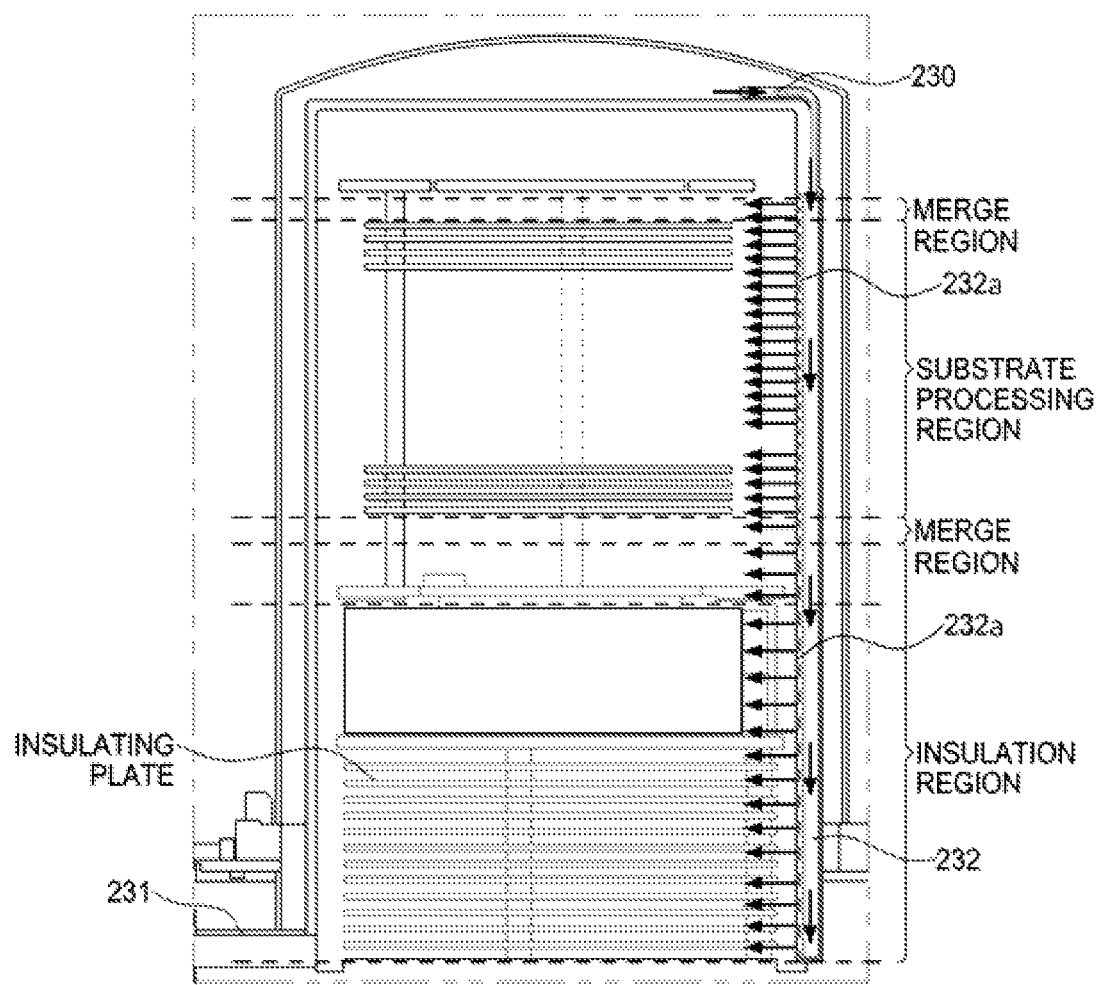
FIG. 10 is a diagram exemplifying a buffer unit provided at the reaction tube of the substrate processing apparatus according to the embodiment of the present disclosure.

The first buffer unit 232 and the plurality of gas supply holes 232a will be described in detail with reference to FIG. 10. FIG. 10 illustrates the processing furnace 202 with the boat 217 loaded in the reaction tube 204. In FIG. 10, only a portion of the wafers 200 is shown. The arrows in FIG. 10 denote the flow direction of the process gas. Two hundred and ten gas supply holes 232a having a diameter of 1 mm each are exemplified in FIG. 10.

For example, the distance (pitch) between neighboring wafers 200 placed in the substrate processing region of the boat 217 is 6.3 mm, and the distance (pitch) between neighboring gas supply holes 232a is also 6.3 mm. As shown in FIG. 10, the plurality of gas supply holes 232a may also be provided in a region (merge region) higher than the uppermost wafer 200 in the substrate processing region where the wafer 200 are stacked such that the gas may be supplied to the merge region higher than the uppermost wafer 200. The plurality of gas supply holes 232a may be provided in a region (merge region) lower than the lowermost wafer 200 in the substrate processing region such that the gas may be supplied to the merge region. According to the first embodiment, the merge regions are provided above and below the substrate processing region. As shown in FIG. 10, a first portion of the plurality of gas supply holes 232a is provided to face the substrate processing region such that a distance between adjacent ones of the gas supply holes 232a in the first portion is equal to a first distance, and a second portion of the plurality of gas supply holes 232a is provided to face the insulating region such that a distance between adjacent ones of the gas supply holes 232a in the second portion is equal to a second distance different from the first distance.

Since the gas may be supplied to the merge region higher than the substrate processing region (substrate region) through the plurality of gas supply holes 232a, the gas is prevented from being stagnant above the boat 217, the generation of particles in the merge region higher than the substrate processing region is suppressed.

For example, in an insulation region of the boat 217 where insulating plates are stacked, the pitch of the neighboring insulating plates is 14 mm, and the pitch between the neighboring gas supply holes 232a is also 14 mm. The lowermost gas supply hole 232a is provided so as to face the gas outlet 231. A support body 257 is provided lower than the gas outlet 231. Since it is difficult to extend the first buffer unit 232 to a region lower than the gas outlet 231, the first buffer unit 232 only extends to where the gas outlet 231 is provided.

As described above, by providing the plurality of gas supply holes 232a to correspond to the lower end of the boat 217, that is, to face the gas outlet 231, the gas is supplied to the lower end of the boat 217. Therefore, the gas may be prevented from being stagnant about the lower end of the boat 217. In particular, since the gas is also supplied to the insulation region through the plurality of gas supply holes 232a, the gas may flow parallel to the surfaces of the insulating plates. Since the gas flow may be formed below the substrate processing region similar to the substrate processing region, the generation of particles due to gas retention at the lower end of the substrate processing region may be suppressed.

Figure 11:
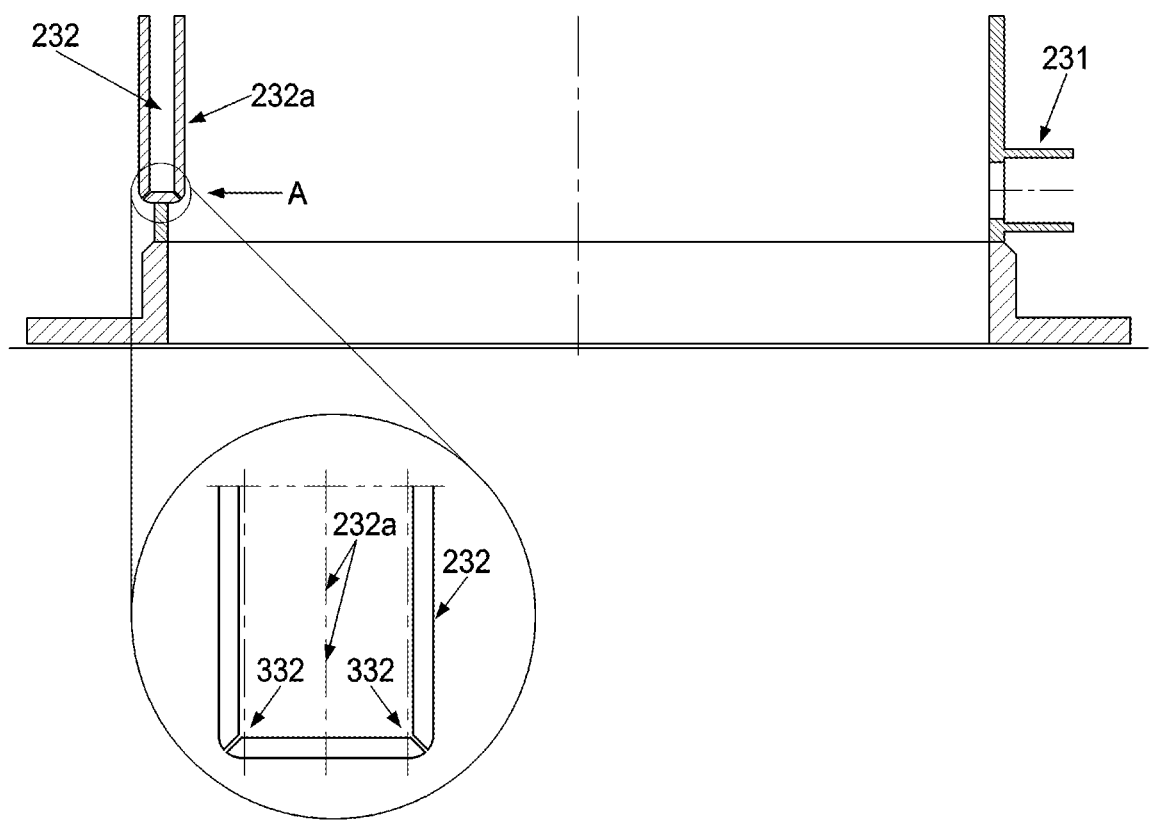
FIG. 11 schematically illustrates a vertical cross-section of a lower portion of the reaction tube of the substrate processing apparatus according to the embodiment of the present disclosure.

As shown in FIG. 11, an opening 332 is provided at the lower end of the first, buffer unit 232. The opening 332 at the lower end of the first buffer unit 232 facilitates the draining of cleaning water from the first buffer unit 232 when the reaction tube 204 is cleaned, thereby improving the efficiency of the>maintenance of the, reaction tube 204. The diameter of the opening 332 may be 2 mm, and the opening 332 may be provided in two locations.

Figure 6:
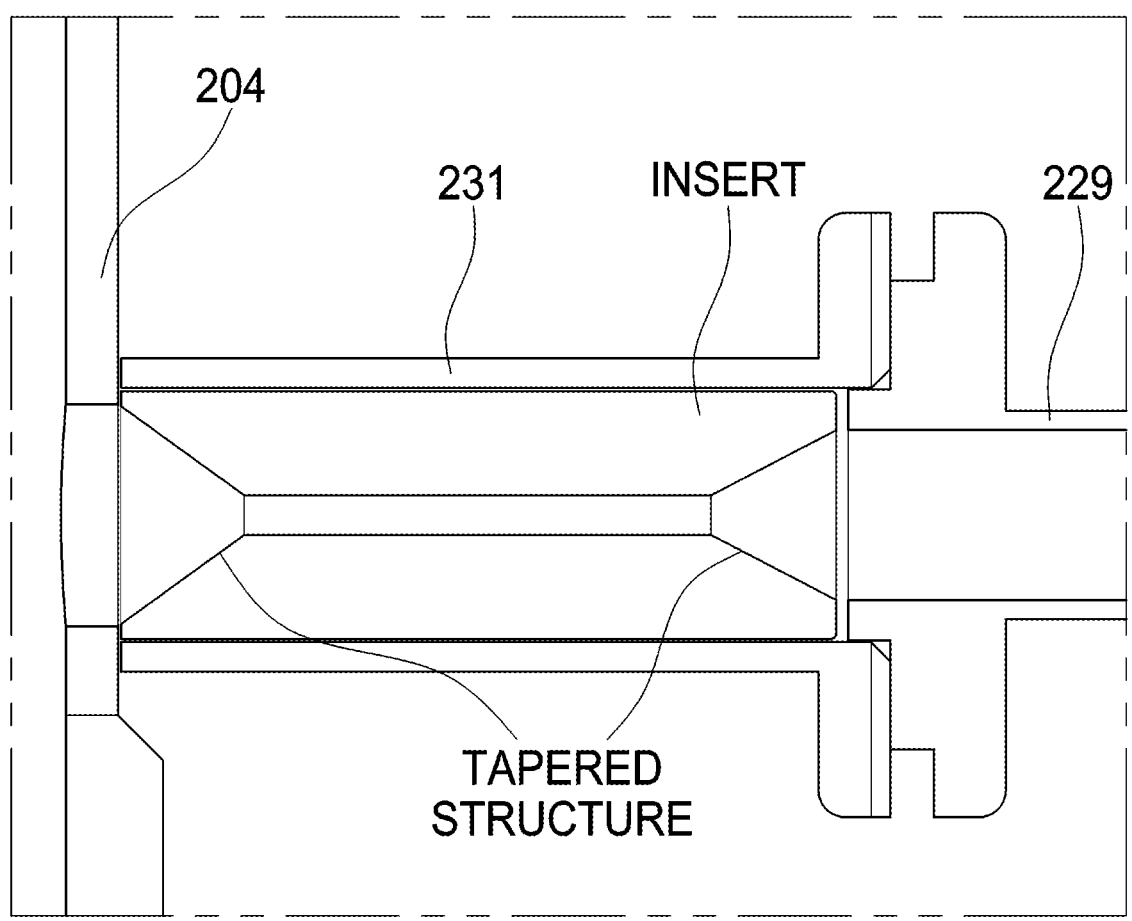
FIG. 6 schematically illustrates a vertical cross-section of a connecting portion of a reaction tube and an exhaust system of the substrate processing apparatus according to the first embodiment.

The gas outlet 231 will be described below with reference to FIG. 6. As shown in FIG. 6, a protection pipe (insert) is provided in the gas outlet 231 according to the first embodiment. The protection pipe is made of quartz similar to the reaction tube 204. The flow path inside the protection pipe is tapered, which forms a tapered flow channel. That is, the cross-sectional area of the flow path inside the protection pipe decreases from the exhaust port 231a toward a downstream side of the gas outlet 231, is constant about the center portion of the protection pipe (or the gas outlet 231), and then increases from the center portion of the protection pipe (or the gas outlet 231) toward the downstream side of the gas outlet 231. For example, the diameter of the flow path of the protection pipe is 24 mm at its maximum, which is almost equal to the diameter of the exhaust port 231a, and the diameter of the flow path of the protection pipe is 10 mm at its minimum.

The protection pipe allows the inner pressure of the process chamber 201 to be higher than the pressure of the exhaust system. Therefore, it is possible to suppress the particles from diffusing back into the process chamber 201 from an exhaust pipe 229 to due to the pressure fluctuation. Even when by-products are adhered to the protection pipe, it is possible to perform maintenance only by exchanging the protection pipe without disassembling the reaction tube 204. Thus, the efficiency of maintenance may be improved. Even when the micro crack is generated on the surface of the protection pipe made of quartz due to the stress of the by-products adhered to the protection pipe, the protection pipe is covered by the gas outlet 231. As a result, the maintenance cycle of the reaction tube 204 may be improved.

In particular, since an oxidation apparatus, a diffusion apparatus or an annealing apparatus is used to process substrates at a high temperature or process the substrates using a chlorine-based (HCL, DCE, etc.) gas, the inside of the processing furnace 202 (reaction tube 204, support body 257, etc.) is covered with quartz. Thus, metal contamination occurring while processing the substrates may be prevented.

A support body 257, which is a base flange capable of hermetically sealing the lower end opening of the reaction tube 204, and a seal cap 219 are provided at the lower end of the reaction tube 204. For example, the seal cap 219 is made of a metal such as stainless steel and has a disc shape, and the support body 257 provided on the seal cap 219 is made of quartz and has a disc shape. An O-ring 220, which is a sealing member in contact with the lower end of the reaction rube 204, is provided on the upper surface of the support body 257.

A rotating mechanism 254 for rotating the boat 217 is provided on the surface of the seal cap 219 opposite to the process chamber 201. A rotating shaft 255 of the rotating mechanism 254 is coupled to an insulation cylinder 218 and the boat 217 through the seal cap 219 and the support body 257. The rotating mechanism 254 rotates the insulation cylinder 218 and the boat 217 to rotate the wafer 200.

The seal cap 219 is vertically elevated by the elevating mechanism 115 vertically installed outside the reaction tube 204 so as to load the boat 217 into or unload the boat 217 from the process chamber 201. The operation control unit 237 is electrically connected to the rotating mechanism 254 and the elevating mechanism 115. The operation control unit 237 may control the rotating mechanism 254 and the elevating mechanism 115 such that the rotating mechanism 254 and the elevating mechanism 115 perform the desired operation at a desired timing.

The boat 217 is made of heat-resistant material such as quartz and SiC and supports a plurality of concentrically aligned waters 200 in horizontal orientation. The insulation cylinder 218, which is an insulating member, is provided below the boat 217 to support the boat 217. The insulation cylinder 218 is made of heat-resistant material such as quartz and silicon carbide and is cylindrical. The insulation cylinder 218 suppresses the heat emitted from the heater 206 from being transmitted to the lower portion of the reaction tube 204.

A temperature sensor (temperature detector) 263 is provided between the liner tube 205 and the reaction tube 204. The temperature control unit 238 is electrically connected to the heater 206 and the temperature sensor 263. The temperature control unit 238 is configured to adjust the energization state of the heater 206 based on the temperature detected by the temperature sensor 263 such that the inner temperature of the process chamber 201 reaches and is maintained at a desired temperature at a desired timing.

As shown in FIG. 3, the exhaust pipe 229 is connected to the gas outlet 231. A pressure adjusting device 242 including an Auto Pressure Controller (APC) valve is connected to the downstream side of the exhaust pipe 229. These components constitute the exhaust system. The pressure control unit 236 is electrically connected to the pressure adjusting device 242. The pressure control unit 236 may be configured to control the exhaust system such that the inner pressure of the process chamber 201 is a predetermined pressure.

Figure 9:
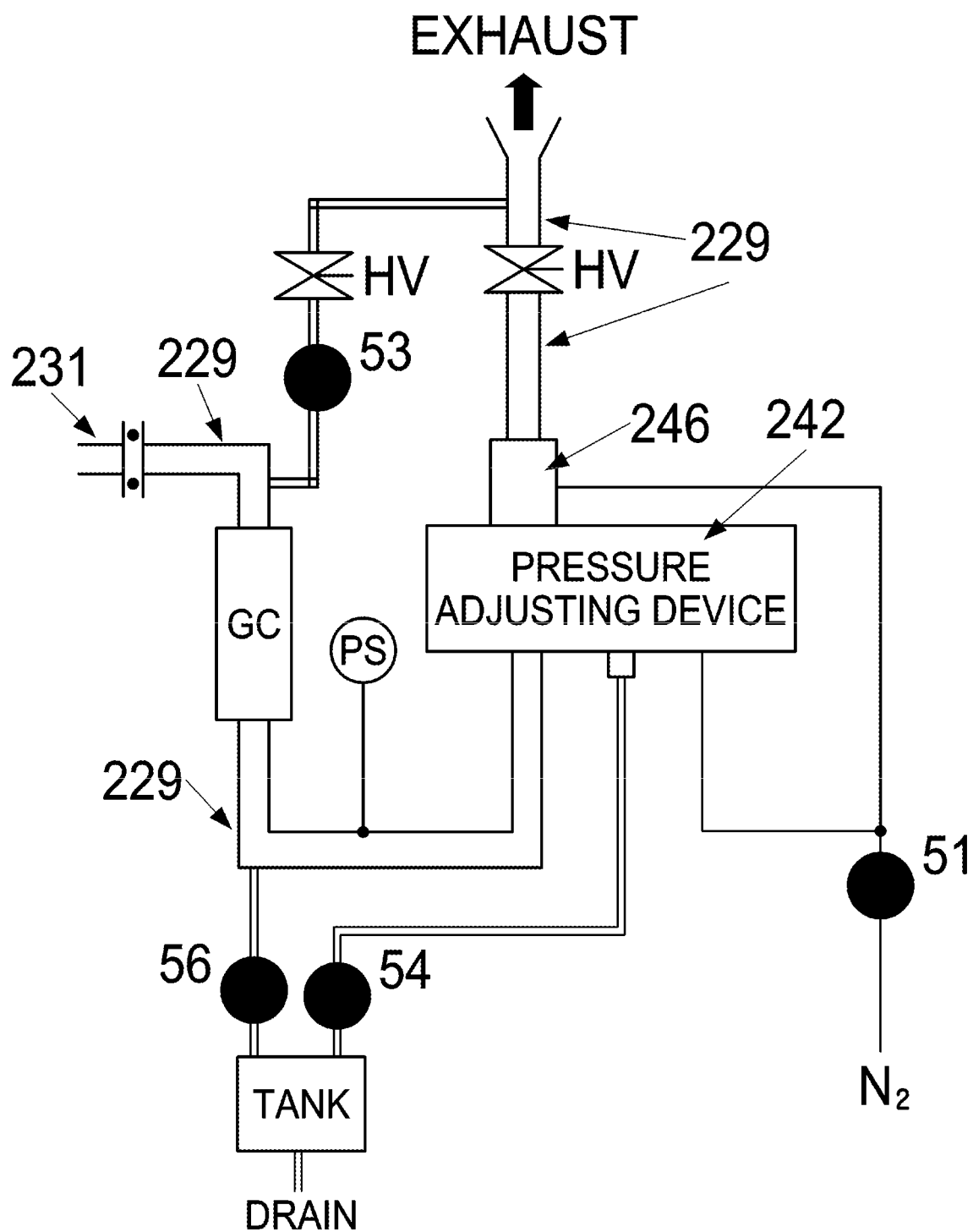
FIG. 9 schematically illustrates an exhaust system of the substrate processing apparatus according to the embodiment of the, present disclosure.

FIG. 9 illustrates the exhaust system according to the embodiment in detail. As shown in FIG. 9, the exhaust system includes the exhaust pipe 229, the pressure adjusting device 242, and an exhaust device (ejector) 246 for exhausting gas from the pressure adjusting device 242. The pressure control unit 236 is configured to control the exhaust device 246 and the opening degree of the APC valve such that the difference between the inner pressure of the process chamber 201 and the pressure of the exhaust system is maintained constant based on the pressure detected by the pressure sensor (not shown).

A cooling gas cooler GC is provided downstream of the exhaust pipe 229. The gas cooler GC cools the exhaust gas exhausted from the process chamber 201. The gas liquefied by the gas cooler GC may be stored in a tank via the air valve (AV) 56 and then discharged from the tank.

A pressure switch (pressure sensor) PS for sensing overpressure in the process chamber 201 is provided at the exhaust pipe 229 on the upstream side of the pressure adjusting device 242. When the inner pressure of the exhaust pipe 229 detected by the pressure switch PS is equal to or higher than a predetermined pressure, the pressure switch PS notifies the pressure control unit 236 of the overpressure. The pressure control unit 236 then controls the valve 53 to open such that the gas is exhausted through a bypass path. As a result, the inner pressure of the process chamber 201 is maintained at the target pressure.

The pressure adjusting device 242 adjusts the opening degree of the valve based on the pressure detected by a pressure sensor (not shown). Even when the gas is liquefied in the pressure adjusting device 242, the liquefied gas may flow into the tank through an air valve 54. An inert gas ($N_2$ gas), which is a dilution gas, may be supplied to the pressure adjusting device 242 through an air valve 51. The pressure adjusting device 242 may also be used to adjust the opening degree of the APC valve.

The exhaust device 246 is configured to maintain a difference between the inner pressure of the process chamber 201 and the pressure of the exhaust system to be constant. When the air valve 51 is opened, $N_2$ gas (dilution gas) may be supplied to the exhaust device 246. The exhaust device 246 may be used to adjust the exhaust performance.

The combination of the pressure adjusting device 242 and the exhaust device 246 may improve the exhaust performance up to −10 KPaG (Kilopascal Gauge). The difference between the inner pressure of the process chamber 201 and the pressure of the exhaust system may be increased as the exhaust performance is improved such that the gas in the process chamber 201 may be exhausted from the process chamber 201 quickly and smoothly. In addition, when the exhaust performance is improved, the particles accumulated in the pipe 229 may be prevented from being diffused back into the process chamber 201.

A heating unit including the heater 206 and the temperature sensor 263 is connected to the temperature control unit 238. The temperature control unit 238 is configured to control the inner temperature of the processing furnace 202 (i.e., the temperature of the process chamber 201) by controlling the electrical power applied to the heater 206. The temperature control unit 238 may be configured to control the electrical power applied to the heater 206 using the switching (ON/OFF) control of a thyristor.

The MFC 235, the pressure control unit 236, the operation control unit 237 and the temperature control unit 238 are electrically connected to the control unit 240 that controls the entire substrate processing apparatus. A sub-control unit includes the MFC 235, the pressure control unit 236, the operation control unit 237 and the temperature control unit 238. The control unit 240 may include the sub-control unit.

Second Embodiment

The second embodiment is described with reference to FIGS. 7 and 8.

Figure 7:
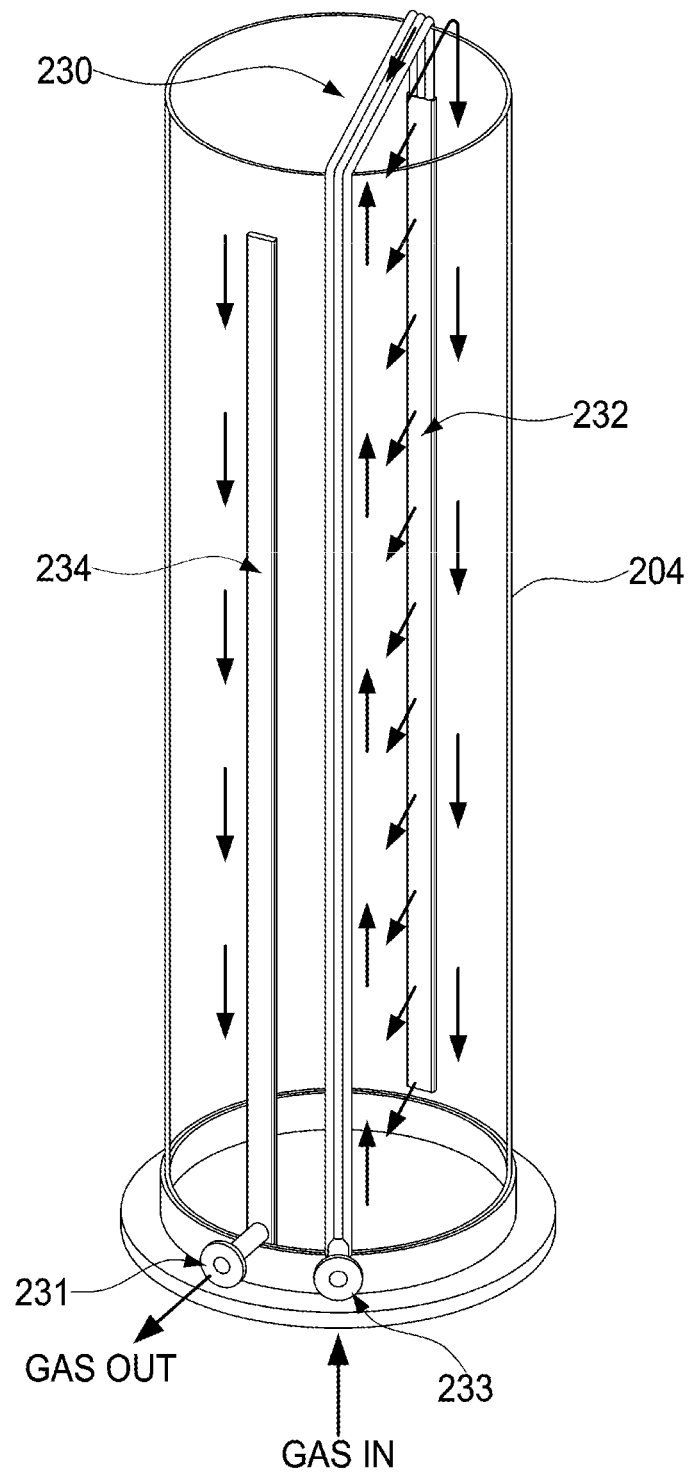
FIG. 7 schematically illustrates a reaction tube structure of a substrate processing apparatus according to a second embodiment.
Figure 8:
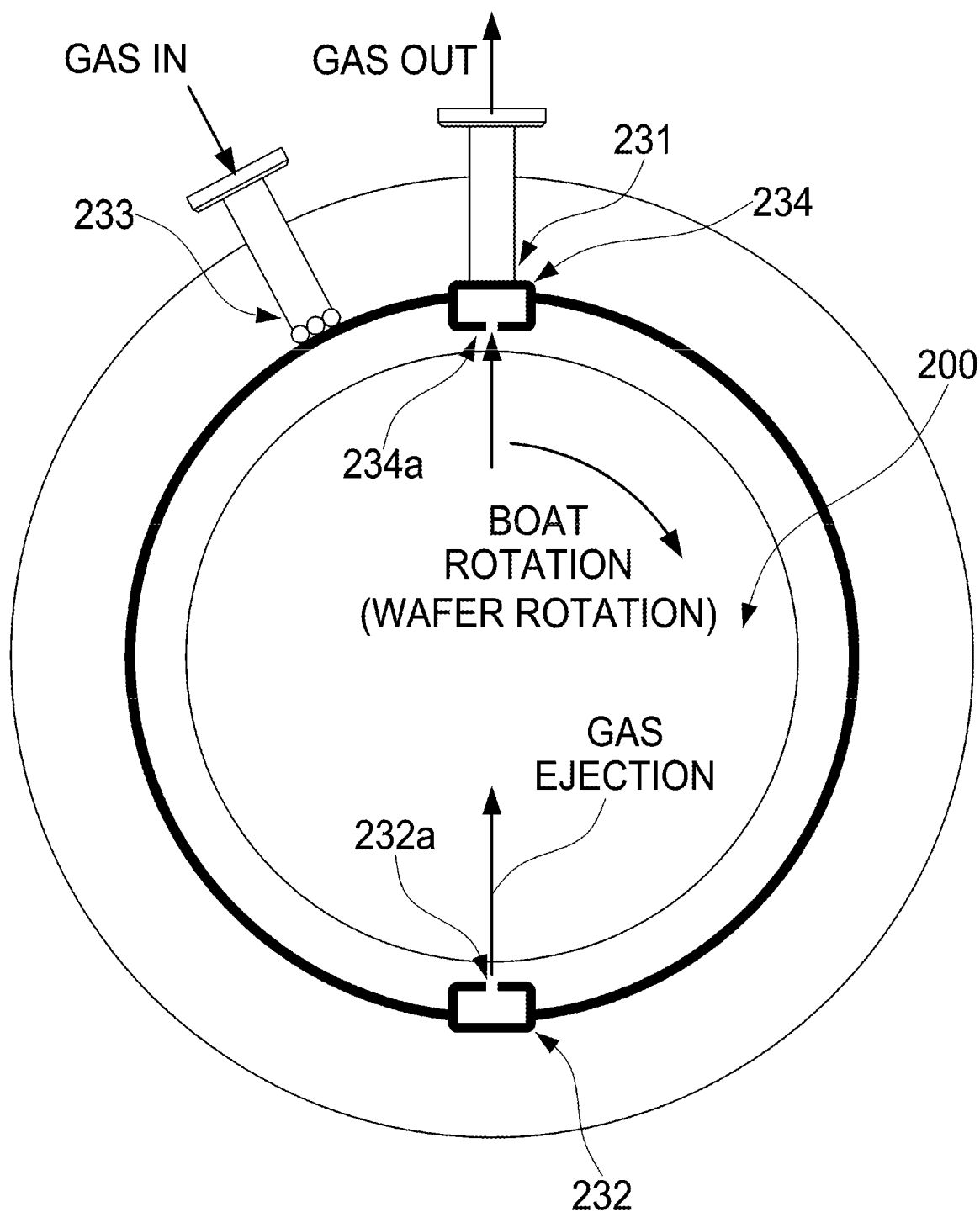
FIG. 8 schematically illustrates a horizontal cross-section of the reaction tube structure of the substrate processing apparatus according to the second embodiment.

The second embodiment shown in FIGS. 7 and 8 differs from the first embodiment shown in FIGS. 4 and 5 in that a second buffer unit (buffer box) 234 is provided at the gas outlet 231. Therefore, only the second buffer unit 234 will be described in detail, and the descriptions of the components the same as those of the first embodiment will be omitted.

First, the reaction tube structure 2040 of the first embodiment shown in FIG. 4 and a reaction tube structure 2040' of the second embodiment shown in FIG. 7 are compared. In the reaction tube structure 2040' according to the second embodiment, the first buffer unit 232 and the plurality of gas supply holes 232a are the same as those of the first embodiment. The reaction tube structure 2040' according to the second embodiment further includes the second buffer unit 234 connected to the gas outlet 231. The second buffer unit 234 is provided in the process chamber 201. A plurality of gas exhaust ports 234a are provided in the second buffer unit 234 to face the center of the process, chamber 201 and the gas outlet 231 connected to the lower end of the second buffer unit 234 is provided at a lower portion of the process chamber 201 opposite to the first buffer unit 121. The other configuration of the reaction tube structure 2040' according to the second embodiment is the same as the first embodiment. Hereinafter, the gas outlet 231 connected to the second buffer unit 234 will be described.

As shown in FIG. 8, the first buffer unit 232 is provided at a first side of the reaction tube 204 and the second buffer unit 234 is provided at a second side of the reaction tube 204, i.e., opposite to the first side. The first buffer unit 232 and the second buffer unit 234 are symmetrical with respect to the center of the wafer 200. The second buffer unit 234 temporarily retains the gas discharged from the process chamber 201 to adjust the exhaust pressure.

Similar to the plurality of gas supply holes 232a, the plurality of gas exhaust ports 334a are provided from the upper end to the lower end of the second buffer unit 234. The second buffer unit 234 and the plurality of gas exhaust ports 234a are respectively installed at heights corresponding to the height of the first buffer unit 232 and the plurality of gas supply holes 232a. Accordingly, the process gas is supplied into the process chamber 201 through the plurality of gas supply holes 232a provided from the upper end to the lower end of the first buffer unit 232, and the process gas is exhausted through the plurality of gas exhaust ports 234a provided from the upper end to the lower end of the second buffer unit 234 and the gas outlet 231.

The plurality of gas exhaust ports 234a and the plurality of gas supply holes 232a symmetrically are provided with respect to the center of the wafer 200, and the pitch of the plurality of gas exhaust ports 234a is the same as that of the wafers 200 charged in the boat 217. The gas is supplied from the plurality of gas supply holes 232a to flow parallel to the surface of the wafers 200 between the wafers 200, and is smoothly exhausted from the process chamber 201 through the plurality of gas exhaust ports 234a.

Similar to the plurality of gas supply holes 232a, the pitch of the gas exhaust ports 234a lacing the substrate processing region of the boat 217 differs from that of the gas exhaust ports 234a facing the insulation region. In addition, since the pitch of the gas exhaust ports 234a facing the insulation region is equal to the pitch of the gas supply holes 232a facing the insulation region, the gas supplied to the insulation region through the gas supply holes 232a may be smoothly exhausted from the process chamber 201 through the gas exhaust ports 234a.

The diameter of each of the gas, exhaust ports 234a ranges, for example, from 1 mm to 5 mm. The second buffer unit 234 may be provided in a manner that the surface on which the plurality of gas exhaust ports 234a are provided is aligned to the inner wall surface of the reaction tube 204. In addition, the second buffer unit 234 may be provided in a manner that the surface of the second buffer unit 234 opposite to the surface on which the plurality of gas exhaust ports 234a are provided is aligned to the inter wall surface of the reaction tube 204.

The volume of the buffer units 232 and 234, the number and the diameter of the gas supply holes 232a, and the number and the diameter of the gas exhaust ports 234a may be determined depending on the flow rate of the gas, the inner pressure and temperature such that the gas is uniformly distributed along the upper portions and the lower portions of the first buffer units 232 and 234.

The comparison of the reaction tube structure 2040 according to the first embodiment shown in FIG. 5 and the reaction tube structure 2040' according to the second embodiment shown in FIG. 8 is as follows. In the reaction tube structure 2040 according to the first embodiment, the first buffer unit 232 and the plurality of gas supply holes 232a are disposed such that the gas flows toward the center of the wafer 200 while, in the reaction tube structure 2040' according to the second embodiment, the first buffer units 232 and the plurality of gas supply holes 232a are disposed in-line with the second buffer units 234 and the plurality of gas exhaust ports 234a such that the gas flows toward the center of the wafer 200. According to the embodiment, the flow velocity of the gas flowing parallel to the surface of the wafer 200 may be increased, and the gas may be smoothly discharged, As shown in FIG. 8, since the gas exhausted from the process chamber 201 necessarily passes through the plurality of gas exhaust ports 234a of the, second buffer unit 234, the particles are prevented from diffusing from the exhaust pipe 229 back into to the process chamber 201. In addition, the inner pressure of the process chamber 201 may be made higher than the pressure of the exhaust system.

The reaction tube structure 2040' according to the second embodiment has the same exhaust system as the first embodiment shown in FIG. 9, and has the first buffer unit 232 on the gas supply side shown in FIG. 10. According to the second embodiment, the protection pipe may also be provided in the gas outlet 231.

Hereinafter, a method of performing processes such as oxidation and diffusion on the wafer 200 (particularly processes such as pyroprocessing, dry oxidation and annealing), which is one of semiconductor device manufacturing processes, using the processing furnace 202 of the substrate processing apparatus 100 according to the first embodiment will be described. In the following description, the operation of each of the components constituting the substrate processing apparatus 100 is controlled by the control unit 240.

After the plurality of wafers 200 are charged into the boat 217 (wafer charging), the boat 217 charged with the plurality of wafers 200 is lifted up by the boat elevator 115 to be transported into the process chamber 201 (boat loading). The boat 217 is loaded into the process chamber 201 and the seal cap 219 seals the lower end of the reaction tube 204 via the support body 257 and the O-ring 220.

The inner pressure of the process chamber 201 is adjusted to a predetermined pressure by the pressure adjusting device 242 and the exhaust device 246 shown in FIG. 9. The process chamber 201 is heated by the heater 206 until the inner temperature of the process chamber 201 reaches a desired temperature by feedback-controlling the energization state of the heater 206 based on the temperature detected by the temperature sensor 263. Subsequently, the rotating mechanism 254 rotates the insulation cylinder 218 and the boat 217 to in turn rotate the wafer 200.

Next, the flow rate of the gas supplied from the process gas supply source (not shown) and the carrier gas supply source (not shown) is adjusted by the MFC 235, and the gas with the flow rate thereof adjusted is supplied to the gas inlet 233 provided at the lower portion of the reaction tube 204. The gas supplied to the gas inlet 233 flows into the thin pipe 230 passing through the ceiling portion of the reaction tube 204 and is then supplied to the first buffer unit 232 provided on the inner wall surface of the reaction tube 204. The gas is then supplied into the process chamber 201 through the plurality of gas supply holes 232a of the first buffer unit 232.

As shown in FIG. 5, the gas ejected through the plurality of gas supply holes 232a passes through the process chamber 201 and comes into contact with the surface of the wafer 200. As a result, processes such as oxidation and diffusion ate performed on the wafer 200. As the boat 217 rotates, the water 200 also rotates such that gas contacts the entire surface of the wafer 200. As shown in FIG. 5, the first buffer unit 232 is provided on one side of the reaction tube 204 and the gas outlet 231 is provided to face the first buffer unit 232. As shown in FIG. 10, the gas is evenly supplied to the wafers 200 since the plurality of gas supply holes 232a are arranged between the wafers 200.

When a heat treatment is performed, the exhaust device 246 shown in FIG. 9 evacuates the process chamber 201 such that the gas is uniformly supplied into the process chamber 201 at a predetermined flow velocity through the plurality of gas supply holes 232a. This makes it possible to exhaust outgas during the beat treatment to the exhaust system. It is possible to suppress particles generated by an increase in outgas.

When a water vapor treatment is performed on the wafer 200, the flow rate of a gas is adjusted to a desired flow rate by the MFC 235, and the water vapor with the flow rate thereof adjusted is then supplied to a water vapor generator (not shown). The gas containing the water vapor ($H_2O$) is then supplied into the process chamber 201.

When a predetermined time elapses, an inert gas is supplied from the inert gas supply source, to replace the inner atmosphere of the process chamber 201 with an inert gas, and the inner pressure of the process chamber 201 is returned to normal pressure.

Thereafter, the seal cap 219 is lowered by the boat elevator 115 and the lower end of the reaction tube 204 is opened. The processed wafers 200 charged in the boat 217 are unloaded from the, reaction tube 204 through the lower end of the reaction tube 204 (boat unloading). The processed wafers 200 are then discharged from the boat 217 (wafer discharging).

Comparative Example

Figure 12:
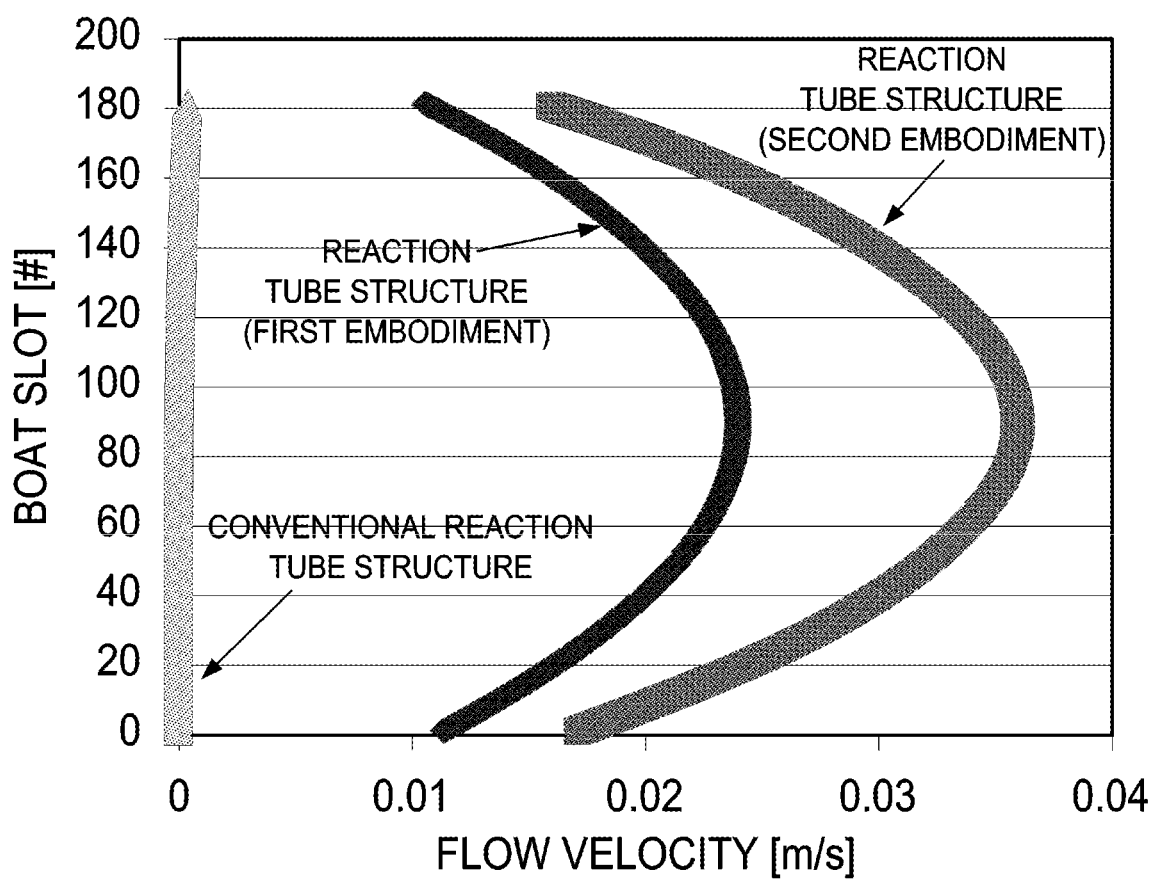
FIG. 12 is a graph depicting flow velocities of gases at the surfaces of wafers according to the first embodiment, the second embodiment and a conventional comparative example.
Figure 13:
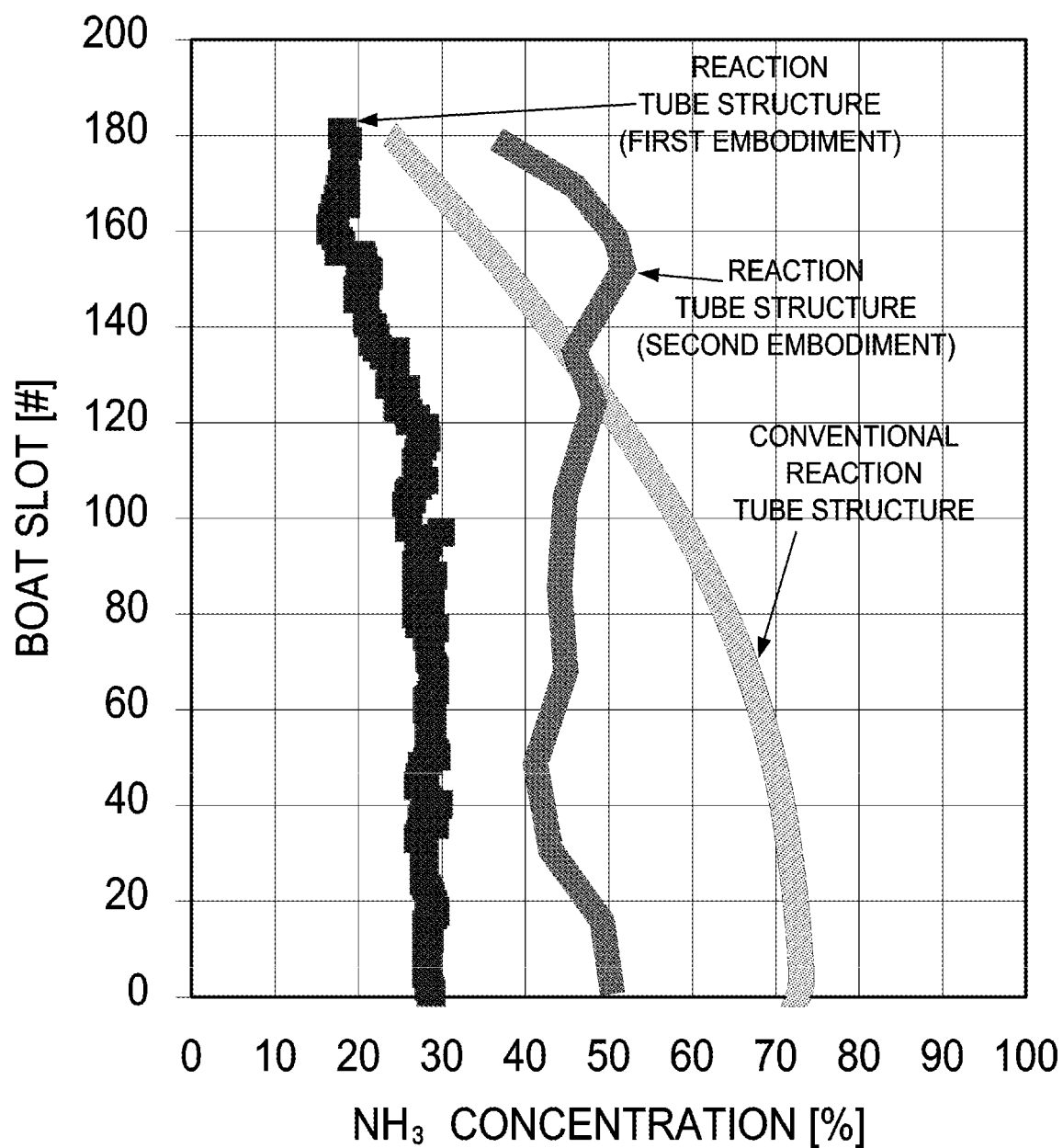
FIG. 13 is a graph depicting concentrations of gases at the surfaces of wafers according to the first embodiment, the second embodiment and a conventional comparative example.
Figure 14:
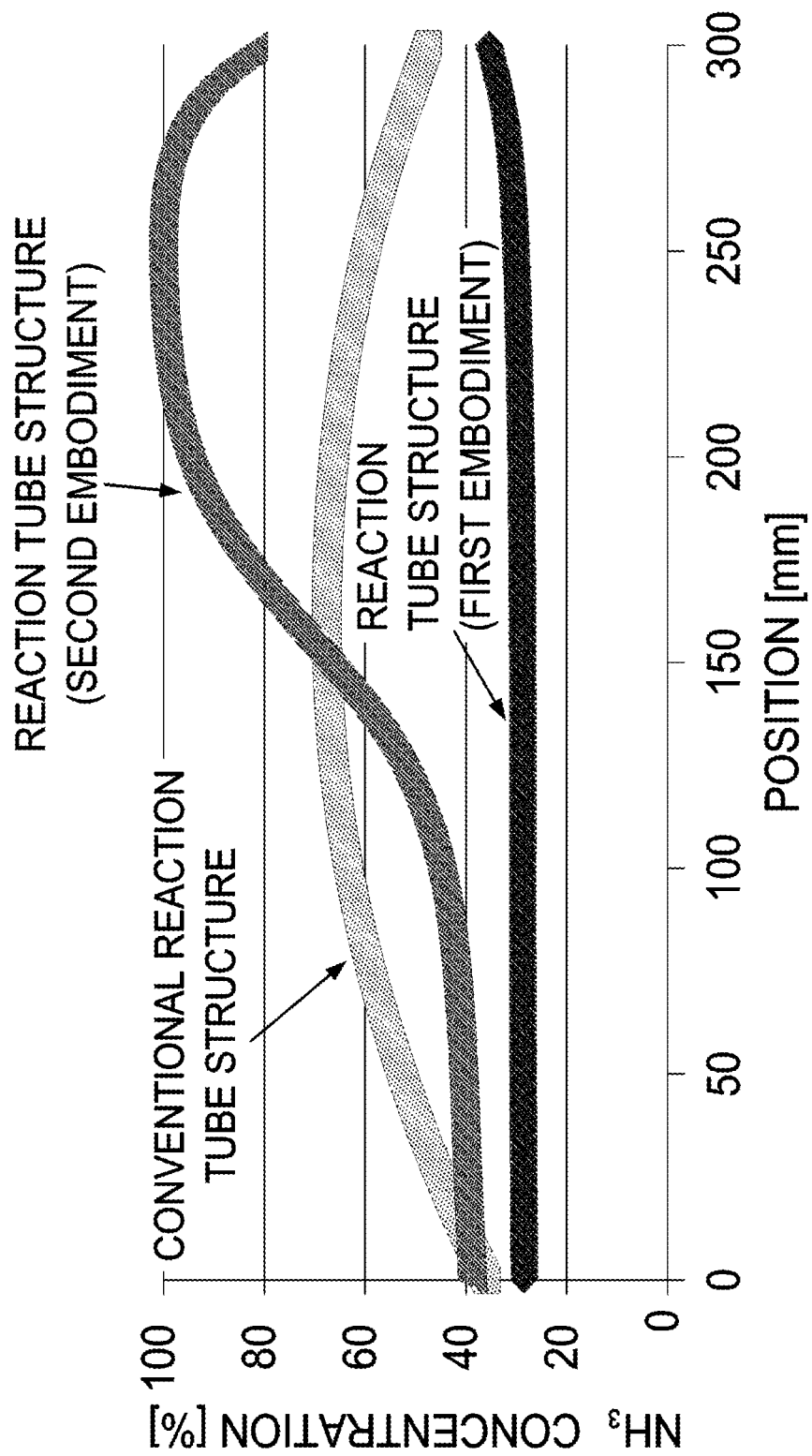
FIG. 14 is a graph depicting concentrations of gases at the surfaces of wafers according to the first embodiment, the second embodiment and a conventional comparative example.

A conventional reaction tube structure, the reaction tube structure 2040 according to the first embodiment and the reaction tube structure 2040' according to the second embodiment are experimentally compared with reference to FIGS. 12 through 14.

FIG. 12 illustrates the flow velocity at the surface of the center of the wafers 200. In FIG. 12, the horizontal axis represents the flow velocity ("FLOW VELOCITY") and the vertical axis represents the boat slot number 9"BOAT SLOT [#]"). The boat slot number is assigned to the support member of the boat 217. As shown in FIG. 12, while the flow velocity in the conventional reaction tube structure is 0.1 mm/sec to 0.4 mm/sec (0.0001 m/sec to 0.0004 m/sec), the flow velocity in the reaction tube structure 2040 according to the first embodiment is 11 mm/sec to 24 mm/sec (0.011m/sec to 0.024m/sec), and the flow velocity in the reaction tube structure 2040' according to the second embodiment is 16 mm/sec to 36 mm/sec (0.016 m/sec to 0.036 m/sec). Thus, according to the first embodiment and the second embodiment, the flow velocity at the surface of the wafer is significantly increased compared to the conventional one. In particular, in the case of measures against outgas, the second embodiment is most preferable.

FIG. 13 and FIG. 14 illustrates the concentration of after a predetermined time period elapses after filling the substrate processing region of the boat 217 with $NH_3$ at an inner temperature of 600° C. and an inner pressure of 1013 hPa, and diluting with 20 slm of $N_2$. In FIG. 13, the vertical axis represents the boat slot number, and the horizontal axis represents the $NH_3$ concentration. In FIG. 14, the vertical axis represents the concentration of $NH_3$, and the horizontal axis represents the distance from the gas inlet. The reason for monitoring the concentration of $NH_3$ in FIG. 13 and FIG. 14 is that $NH_3$ gas is not easily diffused compared to other gases such as $N_2$.

As shown in FIG. 13, the concentration of NH remaining in the substrate processing region of the conventional reaction tube is 25% to 75%, while the concentration of $NH_3$ remaining in the substrate processing region of the reaction tube structure 2040 according to the first embodiment is 15% to 30%, and the concentration of $NH_3$ remaining in the substrate processing region of the reaction, tube structure 2040' according to the second embodiment is 35% to 50%. Therefore, it is concluded that the reaction tube structure 2040 according to the first embodiment is most suitable for discharging the gas.

Referring to FIG. 14, the concentration at the surface (between the gas supply side and the gas exhaust side) of the wafer is as follows. The concentration of $NH_3$ gas remaining on the surface of the wafer in the conventional reaction tube is 40% to 70% while the concentration of $NH_3$ gas remaining on the surface of the wafer in the reaction tube structure 2040 according to the first embodiment is 30% to 40%, and the concentration of $NH_3$ remaining on the surface of the wafer in the reaction tube structure 2040' according to the second embodiment is 40% to 100%. In the case of the reaction tube structure 2040' according to the second embodiment, while the concentration of remaining $NH_3$ in the supply side (first buffer unit) is low, the concentration of remaining $NH_3$ in the exhaust side (second buffer unit) is higher than the conventional reaction tube structure due to the retention of the gas about the plurality of gas exhaust ports 234*a*.

In conclusion, since the reaction tube structure 2040 according to the first embodiment is effective for both increase in the flow rate at the surface of the wafer 200 and, the reduction of particles by the by-product gas, the reaction tube structure 2040 according to the first embodiment is most preferable.

Other Embodiments

In the graph shown in FIG. 14, the cause of the gas retention in the vicinity of the plurality of gas exhaust ports 234*a* of the exhaust side (second buffer unit) according to the second embodiment is that only one pair of the first buffer unit and the second buffer unit with the same number of the gas supply holes 232*a* and the gas exhaust ports 234*a* having the same diameter is provided as shown in FIG. 8. A reaction tube structure with improved first buffer'unit and second buffer unit will be described below.

First, the exhaust efficiency may be improved by increasing, the diameter of each of the gas exhaust ports 234*a* to be greater than that of each of the gas supply holes 232*a*. As a result, the gas retention near the plurality of gas exhaust ports 234*a* may be reduced.

Second, two or more second buffer units 324 may be provided to increase the exhaust area and improve the exhaust efficiency. As a result, the gas retention near the plurality of gas exhaust ports 234*a* may be reduced.

When the two or more second buffer units 234 are arranged at an angle of less than 60 degrees when viewed from above considering the flow rate of gas at the surface of the wafer 200, the gas retention near the plurality of gas exhaust ports 234*a* may be reduced.

As described above, according to the first embodiment and the second embodiment, since the flow rate at the surface of the wafer 200 and the controllability of the inner pressure of the process chamber 201 are improved, uniformity of the film thickness in the oxide film formation by pyroprocessing, dry oxidation and annealing may be improved. In the above embodiments, while the buffer unit is provided on the side wall surface of the reaction tube 204, an addition buffer unit may be provided at the ceiling portion (upper region) of the reaction, tube 204, According to the embodiments, advantageous effects of at least (a) through (g) are provided.

(a) According to embodiments, the buffer unit having the plurality of gas supply holes for introducing the gas into the process chamber is integrated in the side wall surface of the reaction tube, and the plurality of gas supply holes are provided to correspond to the entire boat. Therefore, the gas may flow in parallel to the substrates in the entire boat, and the flow velocity of the gas at the surface of the substrate increases, thereby suppressing the generation of particles depending on the outgas generated from the substrate.

(b) According to the embodiments, the buffer unit having the plurality of gas supply holes for introducing the gas into the process chamber is integrated in the side wall surface of the reaction tube. As the temperature of the gas is elevated while the gas flows from the gas inlet to the buffer unit, the gas may be supplied with the minimum difference between the temperature of the gas and the temperature of the members constituting the reaction chamber. The uniformity of the film formed on the surface of the film and the uniformity between the films formed on the plurality of wafers may be improved. The generation of particles due to the difference between the temperature of the gas and the temperature of the members may be suppressed.

(c) According to the embodiments, the buffer unit having the plurality of gas supply holes for introducing the gas into the process chamber is integrated in the side wall surface of the reaction tube, the plurality of gas supply holes are open toward the center of the wafer, and the plurality of gas supply holes and the plurality of gas exhaust ports are provided symmetrically with respect to the center of the wafer. Therefore, the flow velocity of the gas at the surface of the wafer may be significantly improved. In particular, since the buffer unit (or the plurality of gas supply holes) and the plurality of gas exhaust ports are arranged in-line, the flow velocity of the gas may be increased and the particles may be prevented from diffusing back into the process chamber from the exhaust side.

(d) According to embodiments, the gas flows evenly between the upper portion and lower portion of the buffer unit and is then ejected into the space between the wafers. Therefore, the flow velocity of the gas at the surface of the wafer may be significantly improved. In particular, since the first buffer unit (or the plurality of gas supply holes) and the second buffer unit (or the plurality of gas exhaust ports) having the same height are arranged in-line, the gas flows parallel to the surface of the wafer at higher flow velocity, thereby improving the exhaust efficiency.

(e) According to embodiments, the gas supply holes of the reaction tube structure are provided in the insulation region as well as the substrate processing region of the boat such that the gas retention above the boat and in the insulation region of the boat is suppressed. Therefore, the flow velocity of the gas supplied to the process chamber from the gas supply holes may be maintained at the desired flow velocity, and the generation of particles due to the gas retention in the insulation region may be suppressed, (f) According to the embodiments, the exhaust capability may be remarkably improved by the combination of the pressure adjusting device and the exhaust device. Therefore, the outgas (by-product gas) generated from the wafer may be exhausted from the process chamber in short time, and the particles generated due to the outgas (by-product gas) may be suppressed. Since the difference between the pressure of the exhaust pipe and the inner pressure of the process chamber may be increased, the particles accumulated on the exhaust pipe may be prevented from diffusing back into the reaction chamber.

(g) According to the embodiments, the second buffer unit having the plurality of gas exhaust ports for discharging the gas from the process chamber is integrated in the inner side surface of the reaction tube. Thus, the particles may be prevented from diffusing back into the process chamber from the exhaust system.

While the technique has been described by way of embodiments, the above-described technique is not limited to the embodiments. The above-described techniques may be variously modified without departing from the gist of the embodiments.

While the technique has been described by exemplifying wafer processing, the above-described techniques may also be applied to the substrate processing apparatus for processing substrates such as the glass substrate of the liquid crystal panel.

According to the technique described herein, the flow velocity of the gas at the surface of the wafer may be increased, and particle generation due to the by-product gas may be suppressed.

What is claimed is:

1. A substrate processing apparatus comprising:
   a reaction tube structure, wherein the reaction tube structure comprises:
   a reaction tube defining a process chamber where a plurality of substrates are processed;
   a gas inlet provided at a lower portion of the reaction tube and configured to supply a process gas;
   a first buffer unit where the process gas is temporarily retained, wherein the first buffer unit is disposed at a first side of an inner surface of the reaction tube and comprises a buffer box and a plurality of gas supply holes provided at a side portion of the buffer box that are configured to supply the process gas into the process chamber;
   a connecting pipe disposed between the gas inlet and the first buffer unit to connect the gas inlet to the first buffer unit; and
   a gas outlet formed integrally with the reaction tube at a lower portion of a second side of the inner surface of the reaction tube opposite to the first side, wherein the gas outlet is configured to exhaust the process gas from the process chamber; and
   a substrate retainer having a substrate processing region where the plurality of substrates are accommodated and an insulating region disposed at a lower portion of the substrate processing region,
   wherein a first portion of the plurality of gas supply holes is provided to face the substrate processing region such that a distance between adjacent ones of the gas supply holes in the first portion is equal to a first distance, and a second portion of the plurality of gas supply holes is provided to face the insulating region such that a distance between adjacent ones of the gas supply holes in the second portion is equal to a second distance different from the first distance.

2. The substrate processing apparatus of claim 1, wherein the connecting pipe is connected to the gas inlet provided at the lower portion of the reaction tube, and extends toward a top of the reaction tube along an outer wall surface of the reaction tube to be connected to the first buffer unit at a ceiling portion of the reaction tube.

3. The substrate processing apparatus of claim 1, wherein the connecting pipe comprises a plurality of pipes.

4. The substrate processing apparatus of claim 1, wherein the plurality of gas supply holes are provided from an upper end portion to a lower end portion of the first buffer unit.

5. The substrate processing apparatus of claim 1, wherein the substrate retainer is provided with a plurality of support members configured to support the plurality of substrates, wherein the plurality of gas supply holes are provided from an upper end portion to a lower end portion of the first buffer unit.

6. The substrate processing apparatus of claim 1, further comprising: an exhaust system comprising a pressure adjusting device configured to control a pressure by adjusting an opening degree of a valve and an exhaust device configured to exhaust a gas in the pressure adjusting device; and a control unit configured to control the pressure adjusting device and the exhaust device such that a difference between an inner pressure of the process chamber and a pressure of the exhaust system is maintained.

7. The substrate processing apparatus of claim 6, further comprising a sensor configured to detect an overpressure of the inner pressure of the process chamber, and the control unit is further configured to exhaust a gas from the process chamber through a bypass path when the sensor detects the overpressure.

8. The substrate processing apparatus of claim 1, wherein the reaction tube structure further comprises a second buffer unit connected to the gas outlet and disposed at the second side of the inner surface of the reaction tube opposite to the first side, the second buffer unit having a plurality of gas exhaust ports symmetric to the plurality of gas supply holes of the first buffer unit about a center of each of the plurality of substrates.

9. The substrate processing apparatus of claim 8, wherein the substrate retainer is provided with a plurality of support members configured to support the plurality of substrates at a predetermined distance therebetween, wherein the plurality of gas exhaust ports are disposed at the predetermined distance therebetween.

10. The substrate processing apparatus of claim 8, wherein a first portion of the plurality of gas exhaust ports facing the plurality of substrates is disposed at a first predetermined distance therebetween and a second portion of the plurality of gas exhaust ports facing the insulating region lower than a lowermost substrate of the plurality of substrates is disposed at a second predetermined distance therebetween different from the first predetermined distance.

11. The substrate processing apparatus of claim 1, wherein the reaction tube further comprises:
   a second buffer unit where the process gas is temporarily retained, wherein the second buffer unit is disposed at the second side of the inner surface of the reaction tube opposite to the first side; and
   a plurality of exhaust ports disposed at the process chamber and configured to exhaust the process gas.

12. The substrate processing apparatus of claim 11, wherein the plurality of gas supply holes are provided from an upper end portion of the first buffer unit to a lower end portion of the first buffer unit, and the process gas is supplied through the plurality of gas supply holes into the process chamber, passes through the process chamber, and exhausted through the gas outlet via the second buffer unit.

13. The substrate processing apparatus of claim 1, wherein a protection pipe made of quartz is provided in the gas outlet.

14. The substrate processing apparatus of claim 1, wherein an upstream side of a flow channel comprises a first tapered portion having a cross-sectional area decreasing from a gas exhaust port toward a downstream side thereof,
   a center portion of the flow channel has a cross-section whose diameter is a constant and smallest within the flow channel,
   a downstream side of the flow channel comprises a second tapered portion having a cross-sectional area increasing from the center portion of the flow channel toward the downstream side thereof, and
   a length of the center portion of the flow channel is greater than each length of the first tapered portion and the second tapered portion.

15. The substrate processing apparatus of claim 1, wherein an opening is provided at a lower end of the first buffer unit.

16. The substrate processing apparatus of claim 1, further comprising:
   a protection pipe provided in the gas outlet, the protection pipe comprising a tapered flow channel having an upstream side, a center portion and a downstream side, wherein a cross sectional area of each of the upstream side and the downstream side of the flow channel decreases toward the center portion, and a cross sectional area of the center portion of the flow channel is constant.

17. The substrate processing apparatus of claim 16, wherein a maximum diameter of the protection pipe is almost equal to a diameter of a gas exhaust port of the gas outlet, such that the protection pipe is received within the gas outlet, and a minimum diameter of the protection pipe is smaller than a half of the maximum diameter.

18. The substrate processing apparatus of claim 1, wherein the first distance between the gas supply holes of the first portion facing the substrate processing region is smaller than the second distance between the gas supply holes of the second portion facing the insulating region.

* * * * *